(12) United States Patent
Morita et al.

(10) Patent No.: US 10,050,094 B2
(45) Date of Patent: Aug. 14, 2018

(54) DISPLAY DEVICE

(71) Applicant: Japan Display Inc., Tokyo (JP)

(72) Inventors: Tetsuo Morita, Tokyo (JP); Hiroyuki Kimura, Tokyo (JP); Makoto Shibusawa, Tokyo (JP); Hiroshi Tabatake, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/496,043

(22) Filed: Apr. 25, 2017

(65) Prior Publication Data

US 2018/0019291 A1    Jan. 18, 2018

(30) Foreign Application Priority Data

Jul. 15, 2016  (JP) ................. 2016-140360

(51) Int. Cl.
*H01L 27/15* (2006.01)
*H01L 21/00* (2006.01)
*H01L 27/32* (2006.01)
*H01L 29/786* (2006.01)

(52) U.S. Cl.
CPC ...... *H01L 27/3262* (2013.01); *H01L 27/3265* (2013.01); *H01L 29/7869* (2013.01); *H01L 29/78675* (2013.01); *H01L 29/78696* (2013.01)

(58) Field of Classification Search
CPC ........... H01L 29/7869; H01L 29/78696; H01L 27/3262; H01L 27/3265; H01L 27/3244; H01L 27/3281

USPC ........ 257/79–81, 184; 438/22–24, 27–29, 46
See application file for complete search history.

(56) References Cited

U.S. PATENT DOCUMENTS

| | | | |
|---|---|---|---|
| 8,492,756 B2* | 7/2013 | Sakata | H01L 29/16 257/43 |
| 8,502,216 B2* | 8/2013 | Akimoto | H01L 29/66742 257/40 |
| 2010/0182223 A1 | 7/2010 | Choi et al. | |
| 2013/0234136 A1* | 9/2013 | Arai | H01L 27/1225 257/43 |

FOREIGN PATENT DOCUMENTS

| | | |
|---|---|---|
| JP | 2015-225104 A | 12/2015 |
| WO | 2015/031037 A1 | 3/2015 |

* cited by examiner

*Primary Examiner* — Hsien Ming Lee
(74) *Attorney, Agent, or Firm* — Typha IP LLC

(57) ABSTRACT

Provided is a display device including a plurality of pixels at least one of which has a first transistor and a light-emitting element. The first transistor includes a gate electrode, a gate insulating film over the gate electrode, an oxide semiconductor film over the gate insulating film, and a first terminal and a second terminal electrically connected to the semiconductor film. The second terminal is electrically connected to the light-emitting element. A region in which the first terminal overlaps with the gate electrode can be smaller than a region in which the second terminal overlaps with the gate electrode.

15 Claims, 18 Drawing Sheets

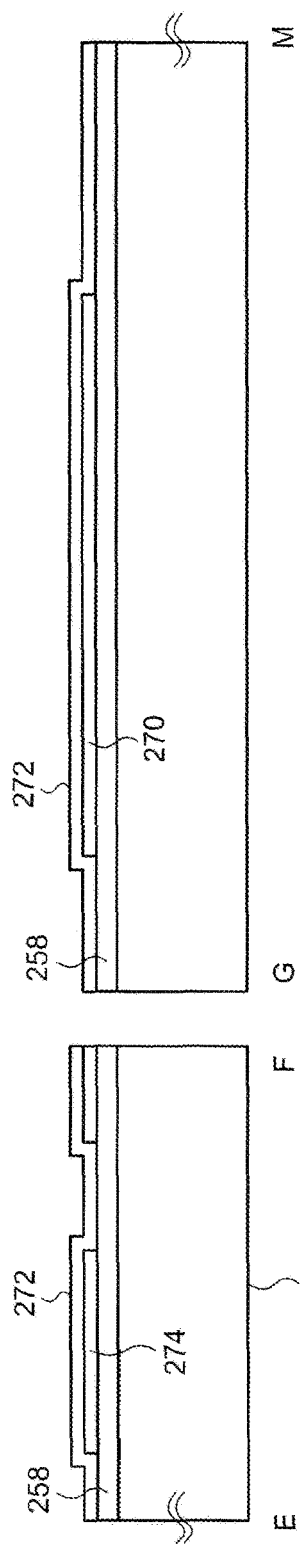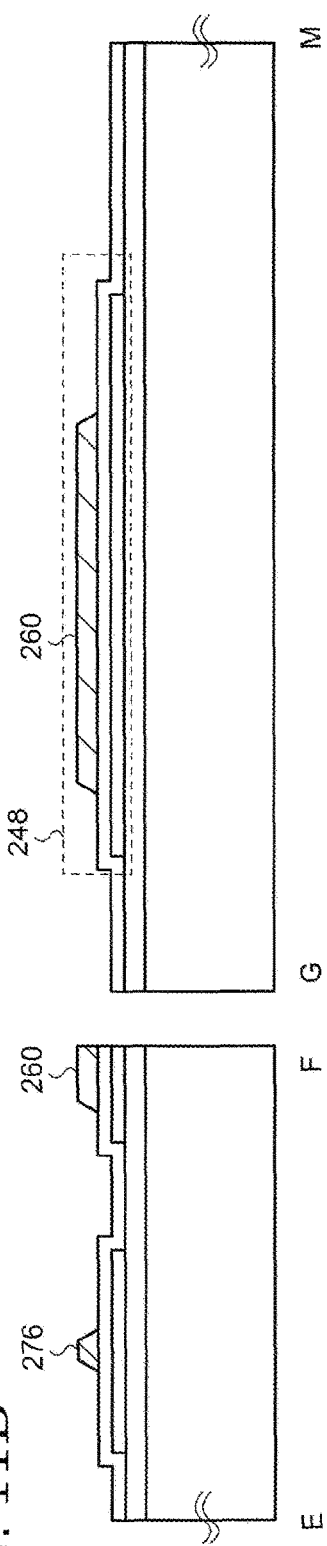

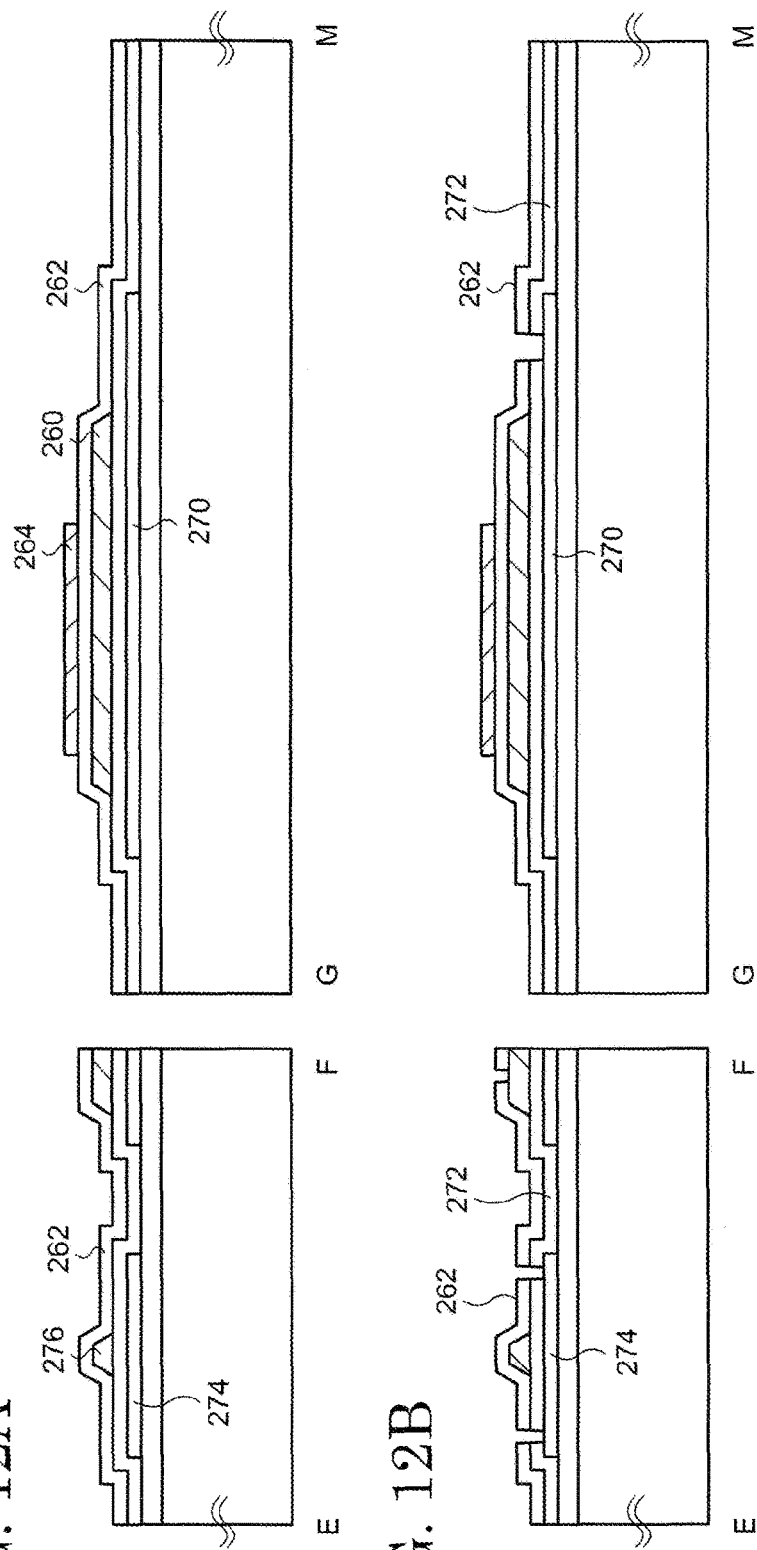

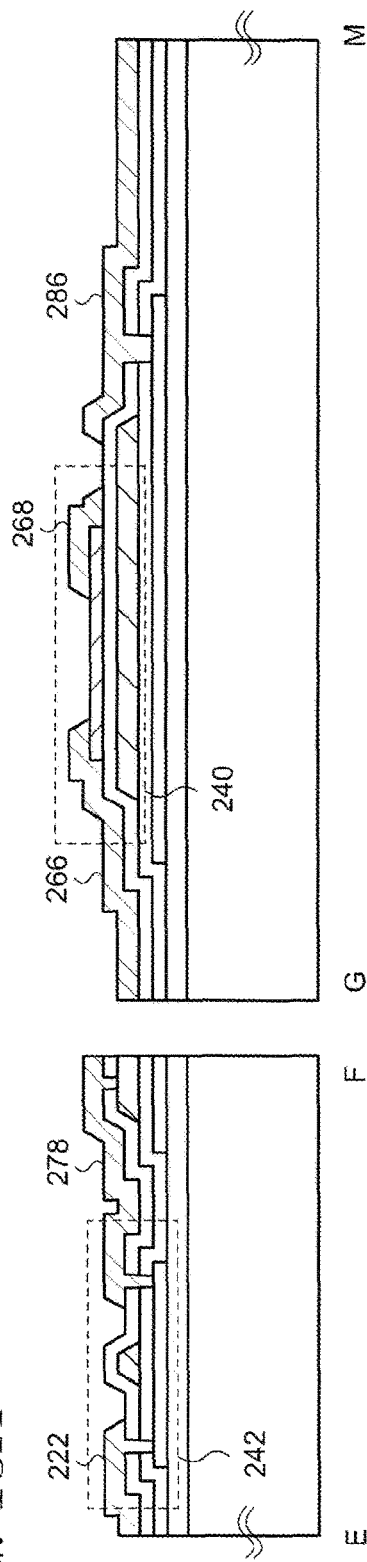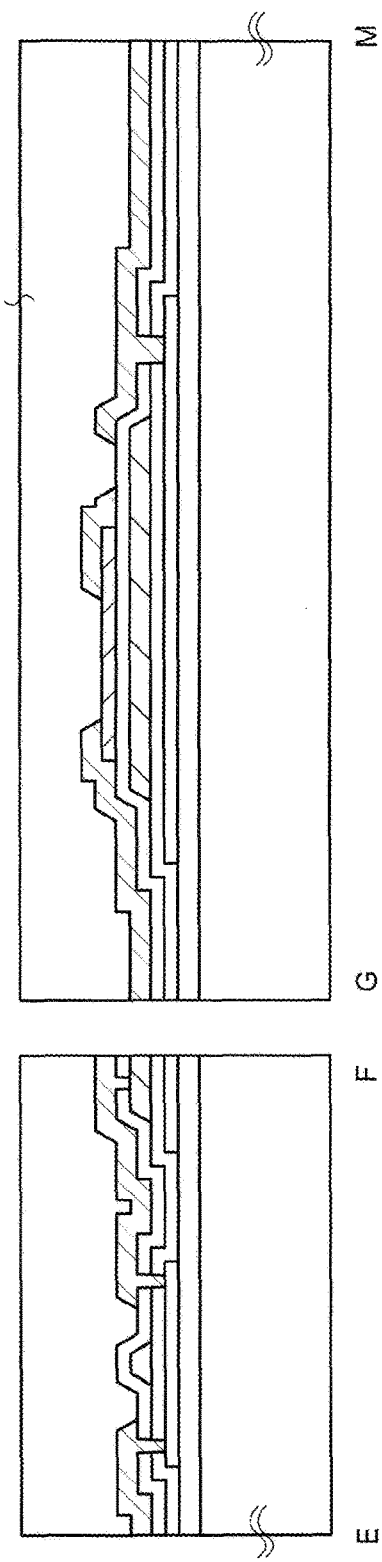

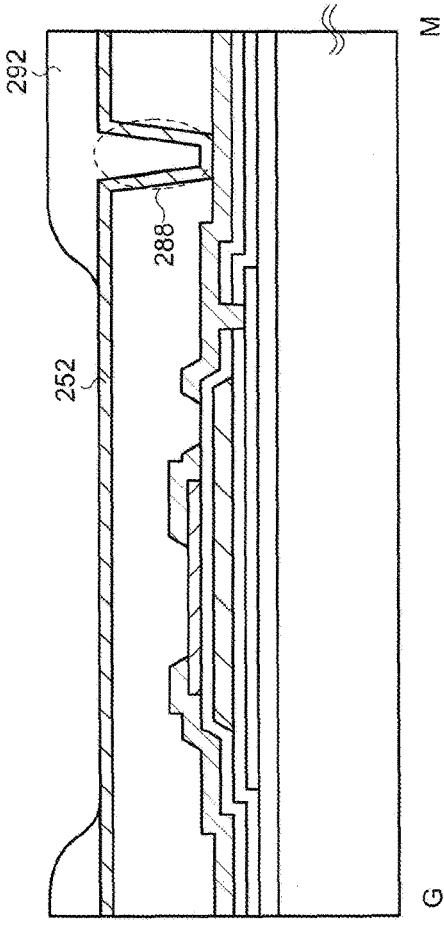
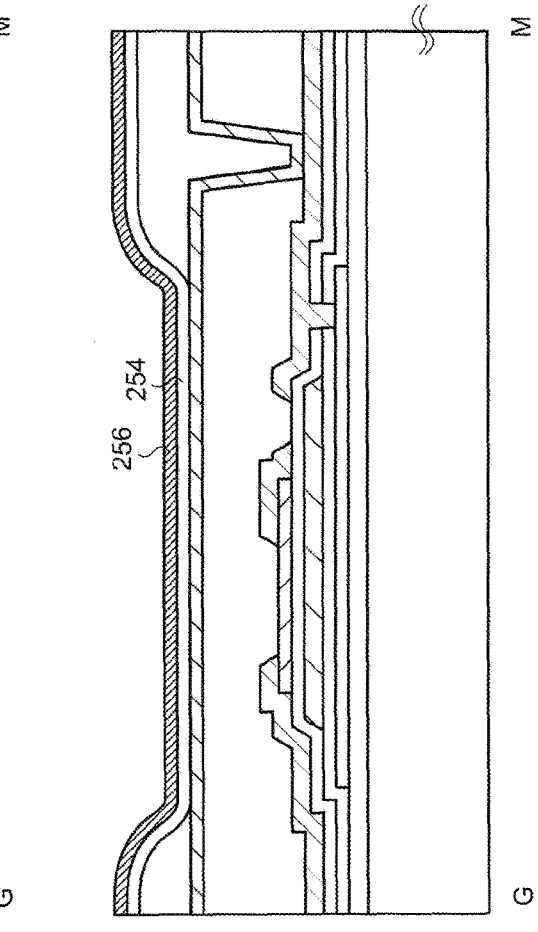
FIG. 15A
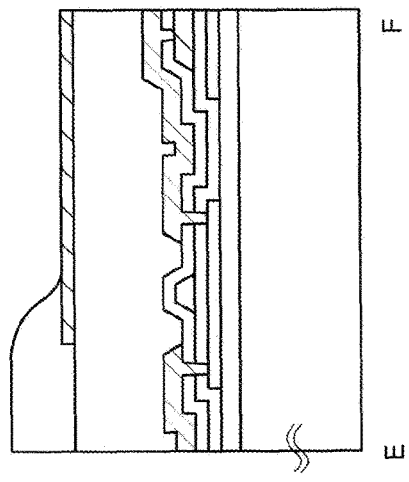
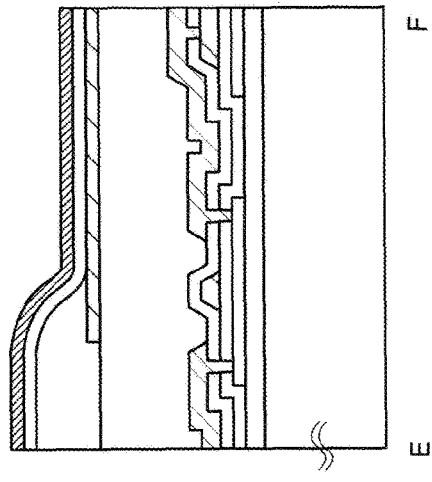
FIG. 15B

US 10,050,094 B2

DISPLAY DEVICE

CROSS REFERENCE TO RELATED APPLICATIONS

This application is based on and claims the benefit of priority from the prior Japanese Patent Application No. 2016-140360, filed on Jul. 15, 2016, the entire contents of which are incorporated herein by reference.

FIELD

An embodiment of the present invention relates to a semiconductor device, a display device including the semiconductor device, such as an organic EL display device, and a manufacturing method thereof.

BACKGROUND

As a typical example exhibiting semiconductor properties, Group 14 elements such as silicon and germanium are represented. Particularly, silicon has been utilized in almost all semiconductor devices because of its wide availability, ease of processing, excellent semiconductor properties, and ease of controlling properties. Similar to silicon, an oxide exemplified by an oxide of Group 13 elements such as indium and gallium also exhibits semiconductor properties and can be utilized in a semiconductor element such as a transistor. For example, as disclosed in Japanese patent application publication No. 2015-225104, International publication No. 2015-031037, and United States patent application publication 2010/0182223, a semiconductor device in which both a transistor having a silicon-containing semiconductor (hereinafter, referred to as a silicon semiconductor) and a transistor having an oxide semiconductor are incorporated and a display device using the semiconductor device have been developed.

SUMMARY

An embodiment of the present invention is a display device including a plurality of pixels, and at least one of the plurality of pixels has a first transistor and a light-emitting element. The first transistor includes a gate electrode, a gate insulating film over the gate electrode, an oxide semiconductor film over the gate insulating film, and a first terminal and a second terminal electrically connected to the oxide semiconductor film. The second terminal is electrically connected to the light-emitting element. A region in which the first terminal overlaps with the gate electrode can be smaller than a region in which the second terminal overlaps with the gate electrode.

BRIEF DESCRIPTION OF DRAWINGS

FIG. 11A and FIG. 11B are schematic cross-sectional views showing a manufacturing method of a display device according to an embodiment of the present invention;

FIG. 12A and FIG. 12B are schematic cross-sectional views showing a manufacturing method of a display device according to an embodiment of the present invention;

FIG. 13A and FIG. 13B are schematic cross-sectional views showing a manufacturing method of a display device according to an embodiment of the present invention;

FIG. 15A and FIG. 15B are schematic cross-sectional views showing a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

In the specification and the scope of claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

In the present embodiment, a structure of a semiconductor device according to an embodiment of the present invention is explained by using FIG. 1A to FIG. 3C.

1. Semiconductor Device 100

Figure 1A:
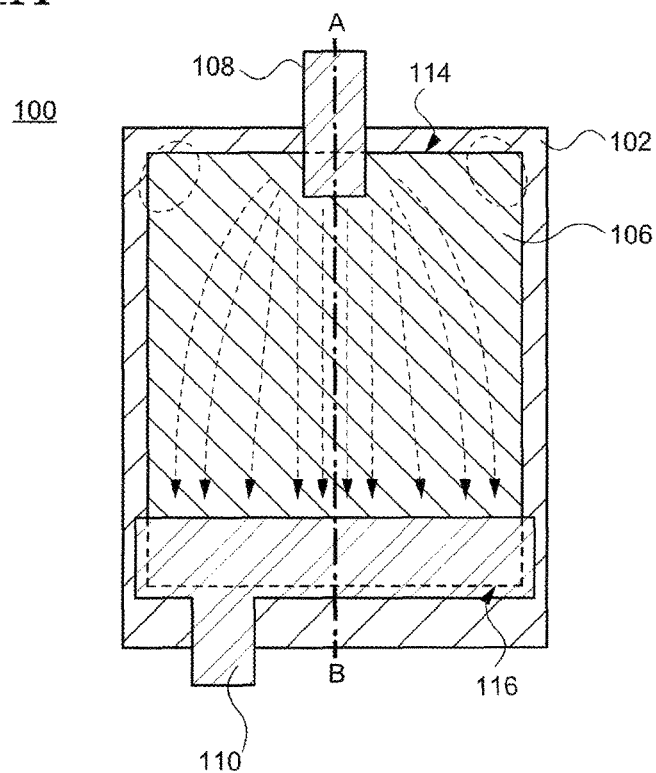
FIG. 1A and FIG. 1B are respectively schematic top and cross-sectional views of a semiconductor device according to an embodiment of the present invention.
Figure 1B:
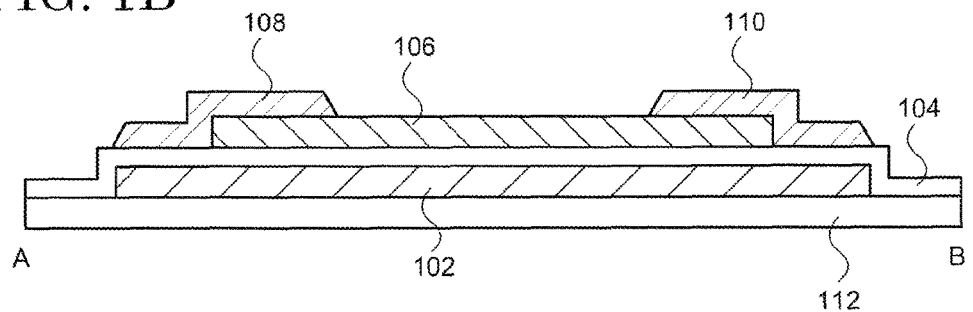
Figure 2:
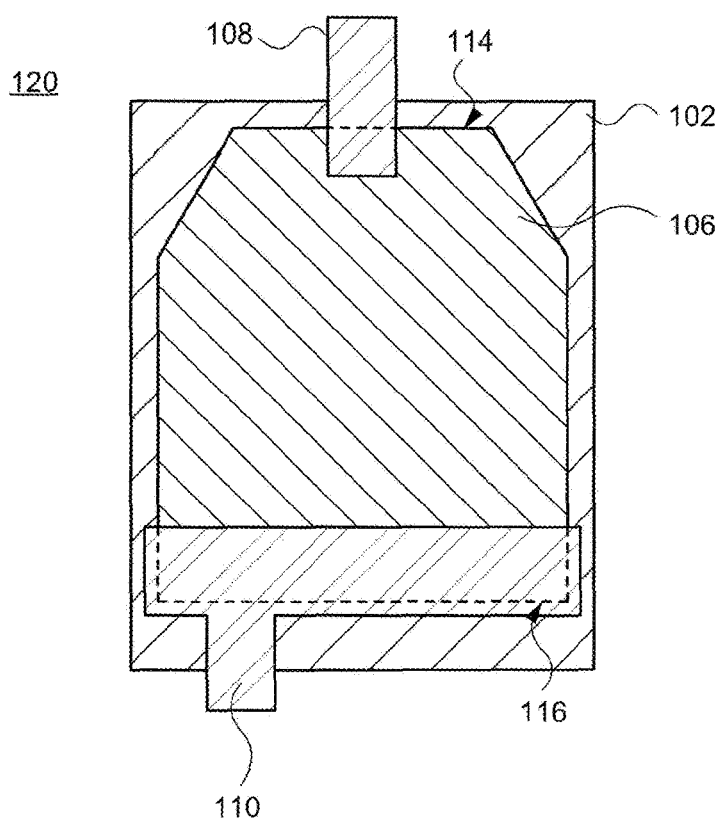
FIG. 2 is a schematic top view of a semiconductor device according to an embodiment of the present invention.

A schematic top view of a semiconductor device 100 according to the present embodiment is shown in FIG. 1A, and a schematic cross-sectional view along a chain line A-B of FIG. 1A is illustrated in FIG. 1B. The semiconductor device 100 is a transistor and possesses a gate electrode 102, a gate insulating film 104 over the gate electrode 102, a film 106 (hereinafter, referred to as an oxide semiconductor film) located over the gate insulating film 104 and including an oxide semiconductor, and a first terminal 108 and a second terminal 110 located over and electrically connected to the oxide semiconductor film 106. The oxide semiconductor film 106 overlaps with the gate electrode 102. As shown in FIG. 1A, the entire bottom surface of the oxide semiconductor film 106 may overlap with the gate electrode 102. Alternatively, the entire top surface of the gate electrode 102 may be covered by the oxide semiconductor film 106. The semiconductor device 100 may be disposed over an insulating film 112 and the like, for example. In FIG. 1A and FIG. 1B, the semiconductor device 100 is illustrated so that the second terminal 110 is in contact with a part of a side surface of the oxide semiconductor film 106. However, it is not always necessary that the second terminal 110 is in contact with the side surface of the oxide semiconductor film 106.

In the present embodiment, the semiconductor device 100 can be designed so that a width of the first terminal 108 is smaller than a width of the second terminal 110. That is, a region in which the first terminal 108 overlaps with the gate electrode 102 may be smaller than a region in which the second terminal 110 overlaps with the gate electrode 102. In other words, a region in which the first terminal 108 overlaps with the oxide semiconductor film 106 may be smaller than a region in which the second terminal 110 overlaps with the oxide semiconductor film 106. Therefore, in the case where a side of the oxide semiconductor film 106 overlapping with the first terminal 108 is defined as a first side 114 and a side opposing the first side 114 and overlapping with the second terminal 110 is defined as a second side 116, a portion of the first side 114 overlapping with the first terminal 108 may be shorter than a portion of the second side 116 overlapping with the second terminal 110. The region in which the second terminal 110 overlaps with the oxide semiconductor film 106 may be twice to twenty times, three times to ten times, or five times to ten times the region in which the first terminal 108 overlaps with the oxide semiconductor film 106.

In the semiconductor device 100, when a potential difference larger than a threshold voltage of the semiconductor device 100 is provided between the gate electrode 102 and the first terminal 108, a current flows as indicated by the dotted arrows in FIG. 1A, and not only a straight current path but also a curved current path are formed. Hence, except the regions (surrounded by a dotted circle in the drawing) close to both edge portions of the first side 114 of the oxide semiconductor film 106, almost the entire oxide semiconductor film 106 can be utilized as a current path. Therefore, a channel width can be maintained even if the width of the first terminal 108 is smaller than the width of the second terminal 110.

On the other hand, although the regions close to both edge portions of the first side 114 of the oxide semiconductor film 106 do not function as a current path, these regions exist in a floating state and behave as an insulating film. Therefore, no parasitic capacitance is formed because no electric field is provided over and under the gate insulating film 104 overlapping with these regions. Additionally, as described above, the width of the first terminal 108 is smaller than the width of the second terminal 110. Hence, the use of the structure shown in the present embodiment enables extremely large reduction in parasitic capacitance formed by the first terminal 108 and the gate electrode 102.

2. Semiconductor Device 120

In FIG. 1A, the oxide semiconductor film 106 is represented so as to have a rectangular shape. However, the shape of the oxide semiconductor film 106 is not limited to this shape and may be square. Furthermore, it is possible to employ a shape in which regions which do not provide a large contribution to the current path are removed. For example, as shown in a semiconductor device 120 of FIG. 2, the first side 114 of the oxide semiconductor film 106 may be shorter than the second side 116. In the semiconductor device 120, the oxide semiconductor film 106 has one or more sides between the first side 114 and a side perpendicularly intersecting the first side 114, and these sides incline from the first side 114 and the second side 116. However, the first side 114 may be linked to the side perpendicularly intersecting the first side 114 via a curve in the oxide semiconductor film 106. Alternatively, the semiconductor film 106 having a trapezoidal shape may be used.

3. Semiconductor Device 130

Figure 3A:
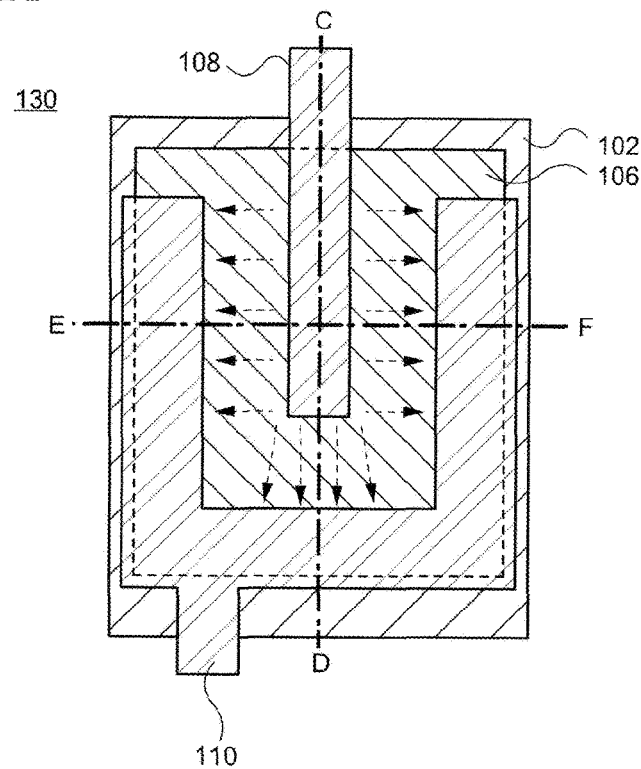
FIG. 3A is a schematic top view of a semiconductor device according to an embodiment of the present invention.
Figure 3B:
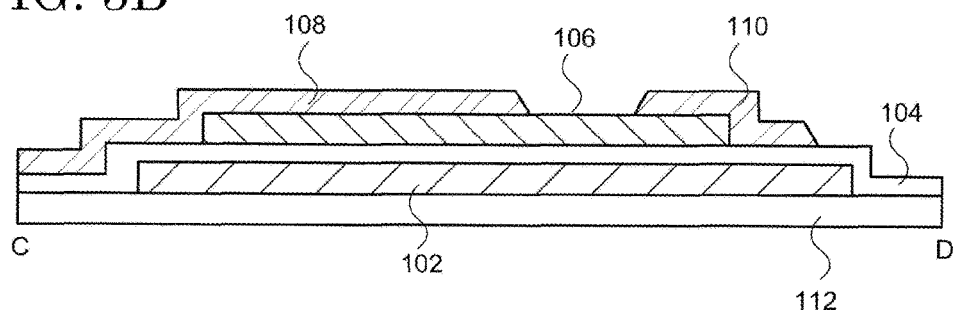
FIG. 3B and FIG. 3C are schematic cross-sectional views of a semiconductor device according to an embodiment of the present invention.
Figure 3C:
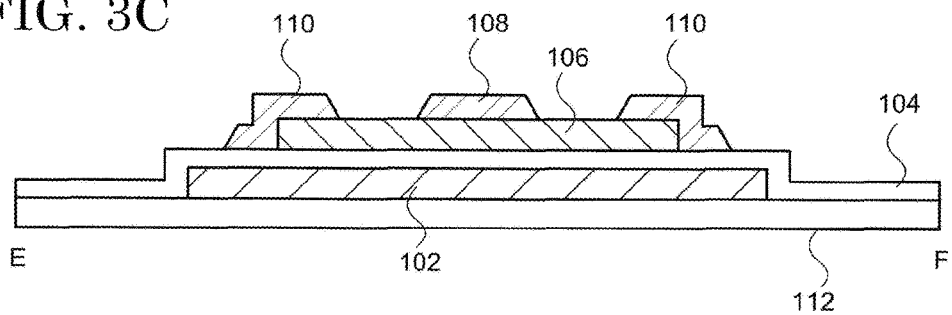

The second terminal 110 may have a shape so as to surround a part of the first terminal 108. For example, as exemplified by a semiconductor device 130 of FIG. 3A, a planer shape of the second terminal 110 may be an open U-shape, and the first terminal 108 may be arranged so as to intersect an opening of this shape as shown in the cross-sectional views (FIG. 3B and FIG. 3C) along chain lines C-D and E-F of FIG. 3A. Application of such a structure allows further expansion of the channel width compared with that of the semiconductor device 100, thereby increasing current-driving force. In this structure, as shown in FIG. 3A and FIG. 3C, the semiconductor film 106 possesses a region sandwiched between a part of the first terminal 108 and a part of the second terminal 110. As indicated by the dotted arrows of FIG. 3A, it is possible to flow current in two opposite directions from the first terminal 108 to the second terminal 110 in this region.

Figure 4A:
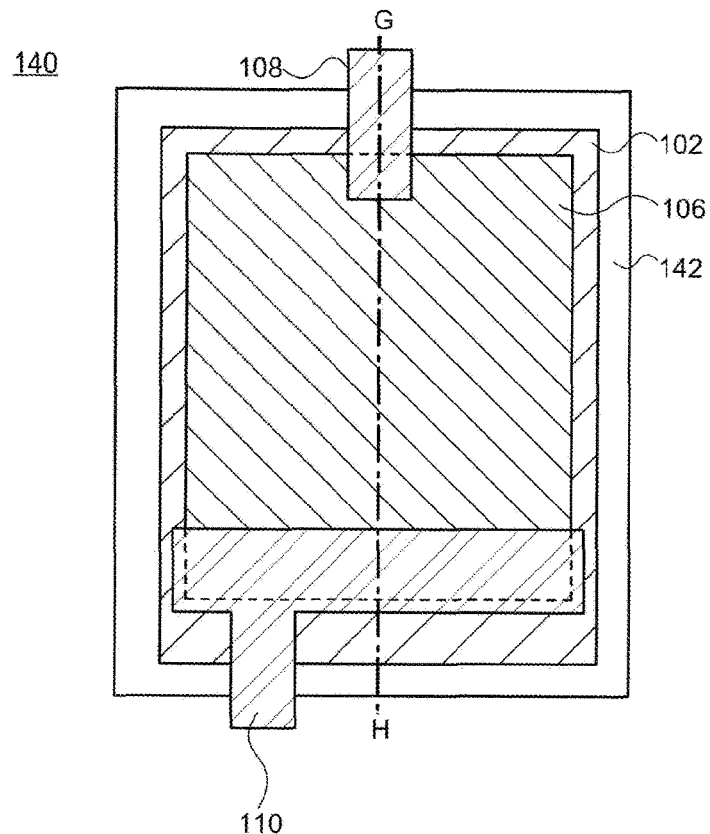
FIG. 4A and FIG. 4B are respectively schematic top and cross-sectional views of a semiconductor device of according to embodiment of the present invention.
Figure 4B:
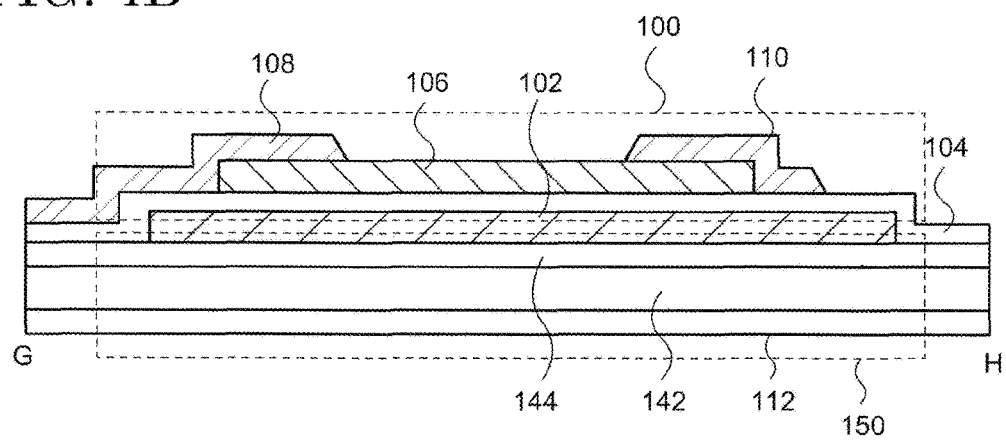

The first terminals 108 and the second terminals 110 of the semiconductor devices 100, 120, and 130 correspond to a source electrode and a drain electrode of a transistor. In the present specification and claims, a source electrode and a drain electrode of a transistor are represented as a terminal because they may be interchanged depending on a direction of current or a polarity of a transistor. Therefore, the first terminal 108 and the second terminal 110 may function as a source electrode and a drain electrode, respectively, and still may function as a drain electrode and a source electrode, respectively Second Embodiment In the present embodiment, a semiconductor device 140 in which the semiconductor device 100 shown in the First Embodiment and a capacitor element (hereinafter, referred to as a capacitor) are stacked is explained by using FIG. 4A and FIG. 4B. FIG. 4A is a schematic top view of the semiconductor device 140, and FIG. 4B is a schematic cross-sectional view along a broken line G-H of FIG. 4A. Explanation of the structures the same as those of the First Embodiment may be omitted.

The semiconductor device 140 has a structure in which the semiconductor device 100 serving as a transistor is stacked over a capacitor 150. Specifically, the semiconductor device 140 possesses a first electrode 142 and an insulating film 144 over the first electrode 142. The semiconductor device 140 further has the semiconductor device 100 over the insulating film 144. As described in the First Embodiment, the semiconductor device 100 includes the gate electrode 102, the gate insulating film 104, the oxide semiconductor film 106, the first terminal 108, and the second terminal 110. In the semiconductor device 140, the gate electrode 102 overlaps with the first electrode 142 with the insulating film 144 sandwiched therebetween to form the capacitor 150 and also functions as the gate electrode of the semiconductor device 100. In other words, the gate electrode 102 is shared by the semiconductor device 100 serving as a transistor and the capacitor 150. The insulating film 144 serves as a dielectric of the capacitor 150.

The entire a bottom surface of the gate electrode 102 overlaps with the first electrode 142 in FIG. 4A. However, the structure of the semiconductor device 140 is not limited thereto, and the entire first electrode 142 may overlap with the gate electrode 102.

Compared with a case where the capacitor 150 and the semiconductor device 100 are arranged so as not to be stacked with each other, the semiconductor device 140 can be reduced in area by stacking the capacitor 150 and the semiconductor device 100, allowing miniaturization of a variety of devices including the semiconductor device 140. For example, a capacitor occupies a large area in pixels of many display devices. Hence, in the case where the semiconductor device 140 is used in a pixel, it is not necessary to increase an area of the pixel even if the semiconductor device 100 with a large size is formed over a large capacitor. Accordingly, the application of the present embodiment enables securement of a large channel width and reduction of a parasitic capacitance formed by the first terminal 108 and the gate electrode 102 without decreasing an aperture ratio of a pixel and resolution of display.

Although not shown, the semiconductor device 120 or 130 of the First Embodiment may be stacked with the capacitor 148.

Third Embodiment

In the present embodiment, a display device including the semiconductor device 100, 120, 130, or 140 described in the First or Second Embodiment is explained by using FIG. 5 to FIG. 9. Explanation of the structures the same as those of the First and Second Embodiments may be omitted.
1. Outline Structure A display device 200 of the present embodiment possesses a display region 206 including a plurality of pixels 204 arranged in row and column directions, gate-side driver circuits 208, and a source-side driver circuit 210 over one surface (top surface) of a substrate 202. The display region 206, the gate-side driver circuits 208, and the source-side driver circuit 210 are disposed between the substrate 202 and an opposing substrate 216.

Display elements such as a light-emitting element and a liquid crystal element giving colors different from one another can be disposed in the plurality of pixels 204, by which full-color display can be conducted. For example, display elements providing red, green, and blue colors may be arranged in three pixels 204, respectively. Alternatively, display elements exhibiting white color may be used in all pixels 204, and full-color display may be performed by using a color filter to extract red, green, or blue color from the respective pixels 204. The colors finally extracted are not limited to a combination of red, green, and blue colors. For instance, four kinds of colors of red, green, blue, and white may be respectively extracted from four pixels 204. The arrangement of the pixels 204 is also not limited, and a stripe arrangement, a delta arrangement, a Pentile arrangement, and the like can be employed.

Figure 6:
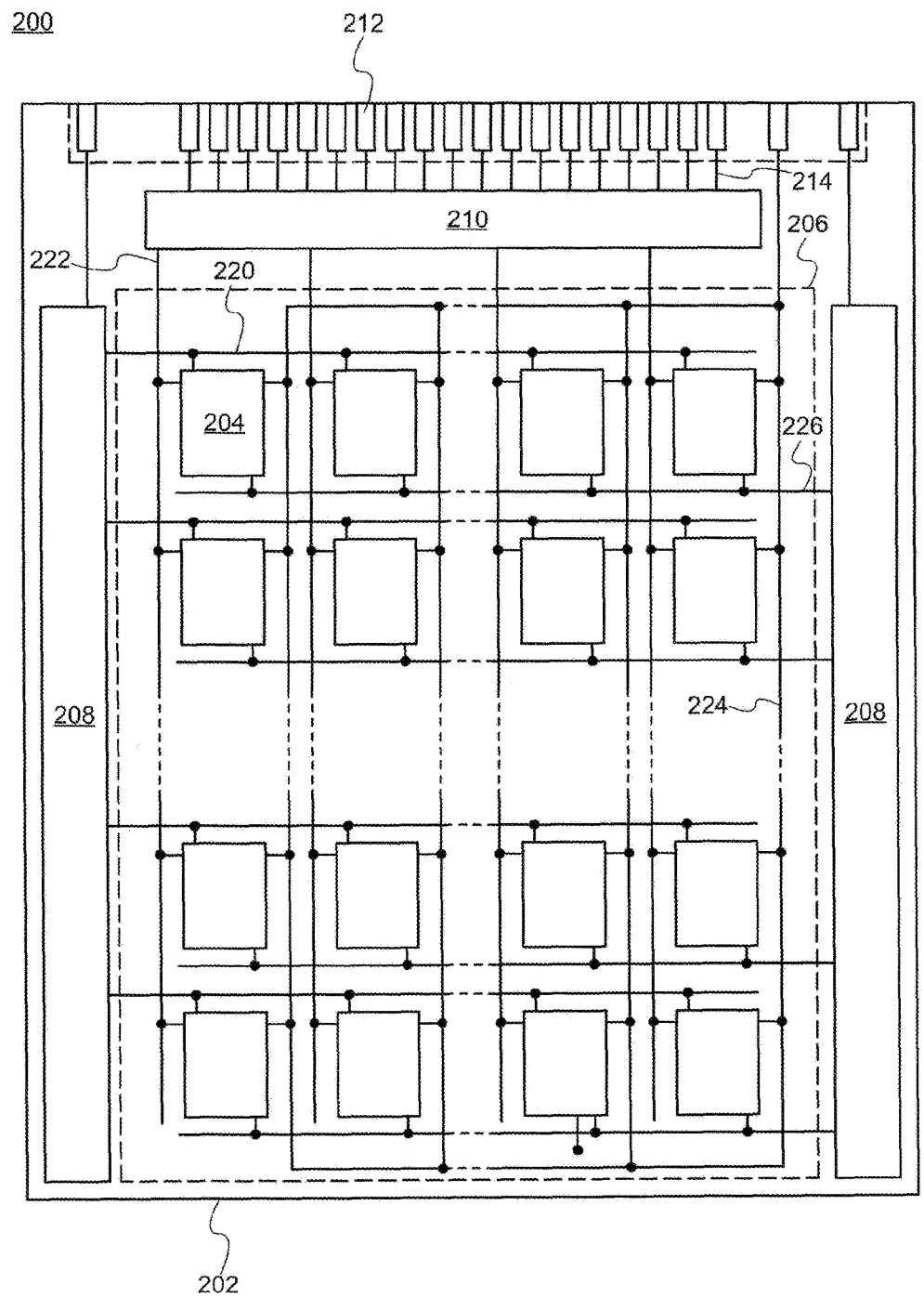
FIG. 6 is a schematic top view of a display device according to an embodiment of the present invention.
Figure 7:
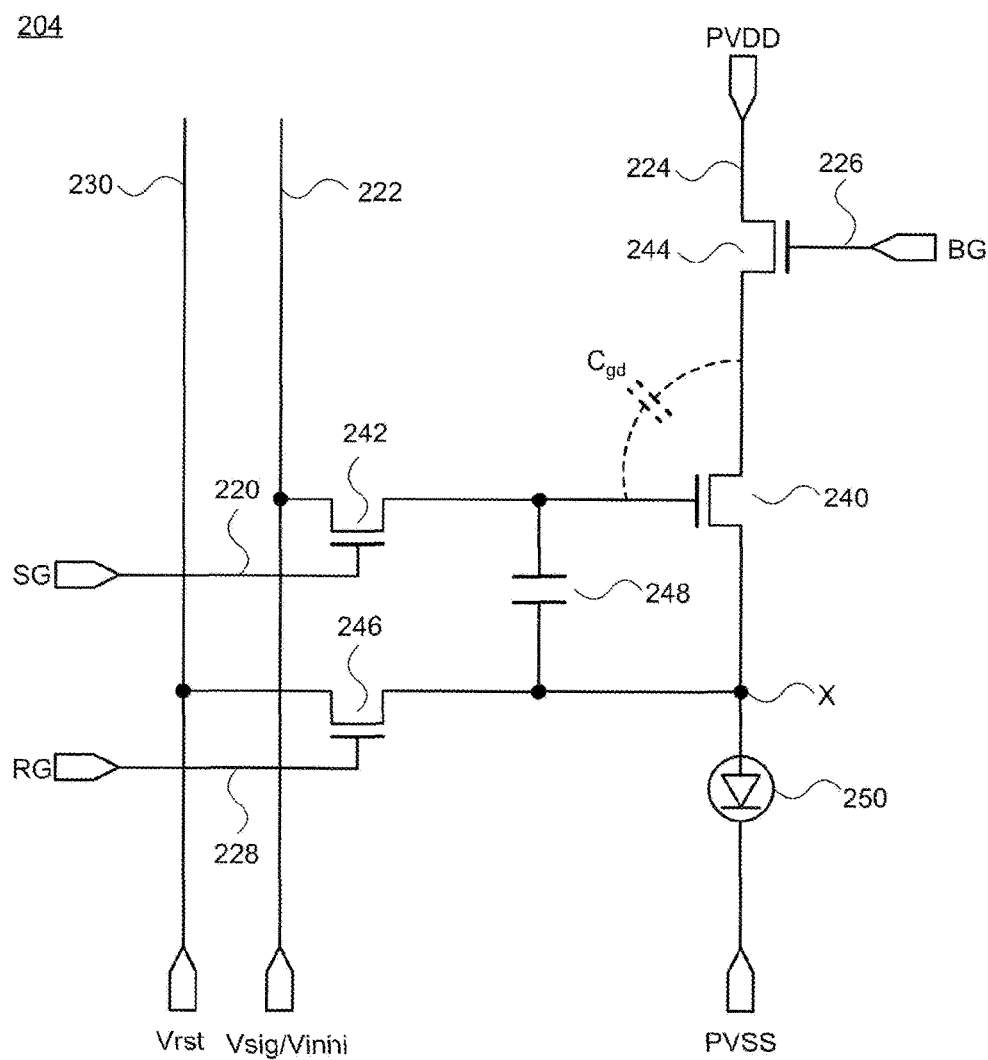
FIG. 7 is an equivalent circuit of a pixel of a display device according to an embodiment of the present invention.

As shown in FIG. 6, a variety of wirings exemplified by first scanning lines 220, second scanning lines 226, and image-signal lines 222 extend in a direction towards the display region 206 from the gate-side driver circuits 208 and the source-side driver circuit 210 and are connected to the respective pixels 204. Wirings 214 extend to a side surface of the substrate 202 (short side of the substrate 202) from the source-side driver circuit 210 and are exposed at an end portion of the substrate 202 to form terminals 212. The terminals 212 are connected to a connector (not shown) such as a flexible printed circuit (FPC). Control signals and image signals supplied from an external circuit (not shown) are input to the gate-side driver circuits 208 and the source-side driver circuit 210, and the image signals are provided to the pixels 204 through the source-side driver circuit 210, by which the display elements of the pixels 204 are controlled, and images are displayed on the display region 206. In the present embodiment, two gate-side driver circuits 208 are arranged so as to sandwich the display region 206. However, only a single gate-side driver circuit 208 may be employed. Furthermore, both or one of the gate-side driver circuits 108 and the source-side driver circuit 210 may not be directly formed over the substrate 102, and a driver circuit fabricated over a different substrate may be mounted over the connector.
2. Pixel Circuit FIG. 7 shows an example of equivalent circuits of the pixel 204. The pixel 204 is connected to the first scanning line 220, the second scanning line 226, a third scanning line 228, the image-signal line 222, a current-supplying line 224, and a reset power-source line 230. The first scanning line 220, the second scanning line 226, and the third scanning line 228 extend in the row direction from the gate-side driver circuits 208 through the plurality of pixels 204. On the other hand, the image signal line 222 intersects the first scanning line 220, the second scanning line 226, and the third scanning line 228 substantially perpendicularly and extends in the column direction through the plurality of pixels 204. The current-supplying line 224 and the reset power-source line 230 are represented so as to extend in the column direction in FIG. 7. However, they may extend in the row direction or in the row and column directions to form a mesh shape.

The pixel 204 possesses, as a semiconductor element, a first transistor 240, a second transistor 242, a third transistor 244, a fourth transistor 246, a capacitor (storage capacitor) 248, and the display element 250. The semiconductor device 100, 120, or 130 described in the First Embodiment can be used for the first transistor 240. Additionally, the semiconductor device 140 shown in the Second Embodiment can be employed as the first transistor 240 and the capacitor 248, and the capacitor 248 and the first transistor 240 can be stacked with each other. In the following explanation, explanation is given for an example where the semiconductor device 140 described in the Second Embodiment is used as the capacitor 248 and the first transistor 240. A connection point of the first transistor 240 and the display element 250 is referred to as a node X.

Note that the equivalent circuit shown in FIG. 7 is simply an example and the number of the transistors is not limited to four and may be two, three, five or more. The number of the transistors can be reduced by providing the fourth transistor 246 in the gate-side driver circuit 208 without forming the fourth transistor 246 in the pixel 204. In this case, the reset power-source line 230 can be extended in the row direction from the gate-side driver circuits 208. Furthermore, the number of the capacitors is not limited to one, and a plurality of capacitors may be included. The combination of the aforementioned wirings is also an example: another wiring may be provided, and a part of the aforementioned wirings may be shared by the plurality of pixels 204.

The display element 250 is selected from a liquid crystal element and a light-emitting element. In the present embodiment, an example is demonstrated in which a light-emitting element is used as the display element 250. As a light-emitting element, a self-emission type element such as an organic electroluminescence (EL) element is represented. The organic EL element includes a pixel electrode, an opposing electrode, and an EL layer sandwiched therebetween.

The second scanning line 226 is connected to a gate electrode of the third transistor 244, and a control signal BG is input to the gate electrode of the third transistor 244. A first terminal of the third transistor 244 is connected to the power-supplying line 224 and applied with a high potential PVDD. A second terminal of the third transistor 244 is connected to a first terminal of the first transistor 240. The first terminal of the first transistor 240 corresponds to the first terminal 108 of the semiconductor device 140 shown in FIG. 4A and FIG. 4B.

A gate electrode of the second transistor 242 is connected to the first scanning line 220 and applied with a control signal SG. A first terminal of the second transistor 242 is connected to the image-signal line 222 and applied with an image signal Vsig or an initializing signal Vini. A second terminal of the second transistor 242 is connected a gate electrode of the first transistor 240 and one electrode (second electrode) of the capacitor 248. The gate electrode of the first transistor 240 and the one electrode of the capacitor 248 are shared and utilized as the gate electrode 102 of the semiconductor device 140 shown in FIG. 4A and FIG. 4B.

A second terminal of the first transistor 240 corresponds to the second terminal 110 of the semiconductor device 140 and is connected to the other electrode (first electrode) of the capacitor 248 and the pixel electrode of the display element 250. The other electrode of the capacitor 248 corresponds to the first electrode 142 of the semiconductor device 140 shown in FIG. 4A and FIG. 4B.

A gate electrode of the fourth transistor 246 is connected to the third scanning line 228 and input with a control signal RG. A first terminal of the fourth transistor 246 is connected to the reset power-source line 230 and applied with a reset potential Vrst. A second terminal of the fourth transistor 246 is electrically connected to the other electrode of the capacitor 248 and the pixel electrode of the display element 250.

The opposing electrode of the display element 250 is applied with a low potential PVSS.

Hereinafter, operation of the pixel 204 is explained. Operation of the pixel 204 is divided into an initializing period, an offset-canceling period, an image-signal writing and mobility-canceling period, and an emission period.

The initializing period is explained. The control signal RG is input to the gate electrode of the fourth transistor 246 to turn on the fourth transistor 246. With this operation, the reset potential Vrst is provided to the first electrode of the capacitor 248, the pixel electrode, and the second terminal of the first transistor 240 from the reset power-source line 230, by which a potential of the second terminal of the first transistor 240 is reset. Simultaneously, in the display element 250, a potential difference between the pixel electrode and the opposing electrode becomes zero or lower than an emission-starting voltage, and emission is terminated if the display element 250 is in an emission state.

After that, the control signal SG is applied to the gate electrode of the second transistor 242 to turn on the second transistor 242. At this time, the image-signal line 222 is applied with the initializing signal Vini, by which initialization is performed so that a potential of the gate electrode of the first transistor 240 becomes a potential corresponding to the initialization signal Vini.

Next, the offset-canceling period is explained. The fourth transistor 246 is turned off, and the control signal SG is input to the gate electrode of the second transistor 242 to turn on the second transistor 242. Furthermore, the gate electrode of the third transistor 244 is provided with the control signal BG to turn on the third transistor 244. At this time, a gate potential becomes Vini, and a potential of the first terminal (drain potential) becomes PVDD in the first transistor 240, while a potential of the node X increases until a potential difference between the gate electrode of the first transistor 240 and the node X becomes almost the same as a threshold voltage of the first transistor 240. The increase at this time depends on the threshold of the transistor 240 in each pixel 204.

After the offset-canceling operation is completed, the operation shifts to the image-signal writing and mobility-canceling period. The image signal line 222 is input with the image signal Vsig, by which the image signal Vsig is written to the gate electrode of the first transistor 240.

In a period after the writing of the image signal Vsig is started and before the second transistor 242 is turned off, the potential of the node X begins to increase because the first transistor 240 is turned off by writing Vsig. An increasing rate of the potential of the node X becomes large with increasing mobility of the first transistor 240. Therefore, at the moment when the second transistor 242 is turned off, a potential difference between the gate electrode of the first transistor 240 and the node X is relatively small in the case of a transistor with a high mobility, while the difference is relatively large in the case of a transistor with a low mobility. With this operation, the mobility is canceled.

After that, the second transistor 242 is turned off by which the gate electrode of the first transistor 240 becomes a floating state. Since the capacitor 248 is provided to the gate electrode and the second terminal of the first transistor 240, variation of the potential of the second terminal causes variation of the potential of the gate electrode due to a bootstrap operation.

After that, the operation shifts to the emission period. Current flows between the first terminal and the second terminal of the first transistor 240, and display is maintained by the control signal BG until the third transistor 244 is turned off by the control signal BG.

3. Pixel Structure

Figure 8:
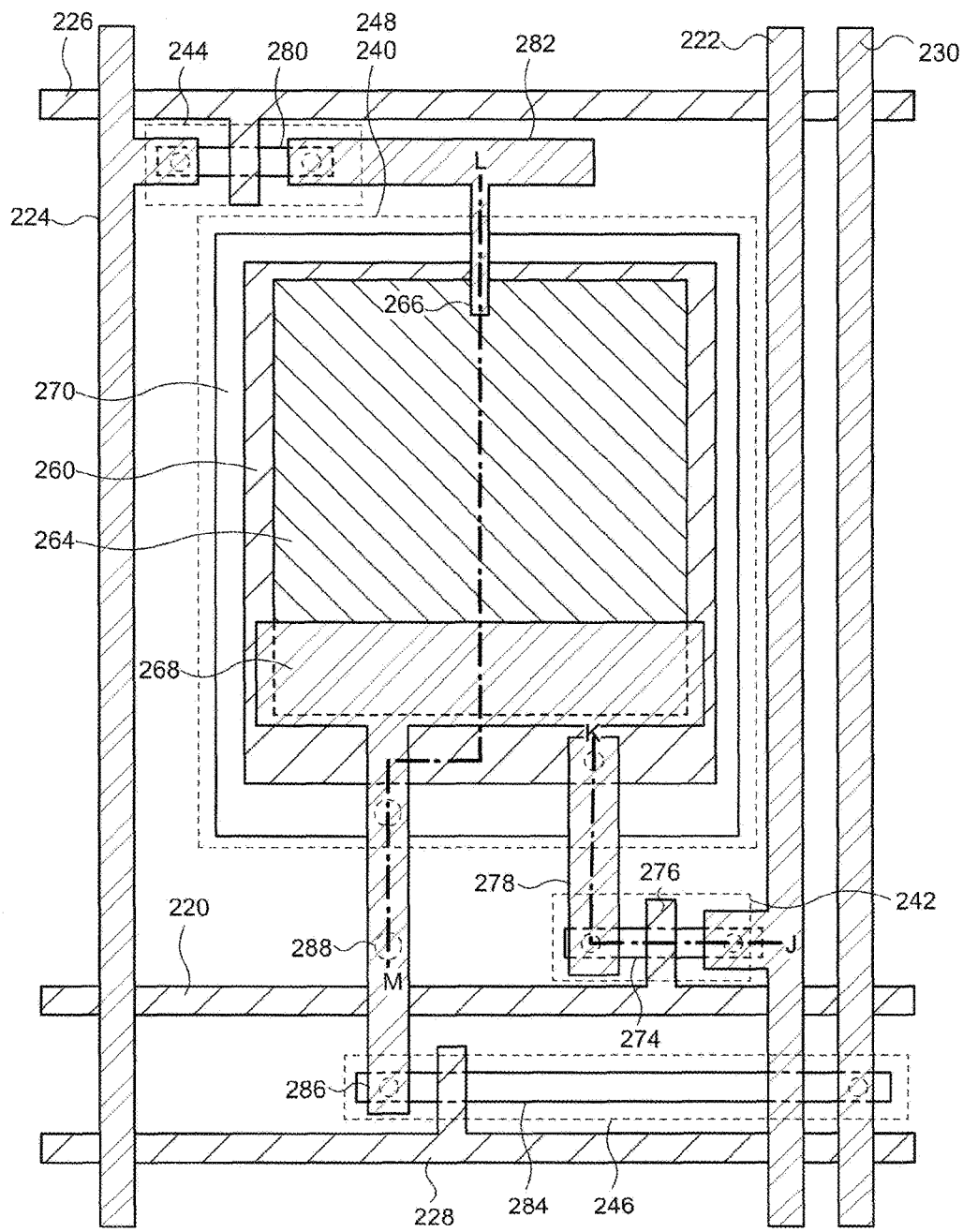
FIG. 8 is a schematic top view of a pixel of a display device according to an embodiment of the present invention.
Figure 9:
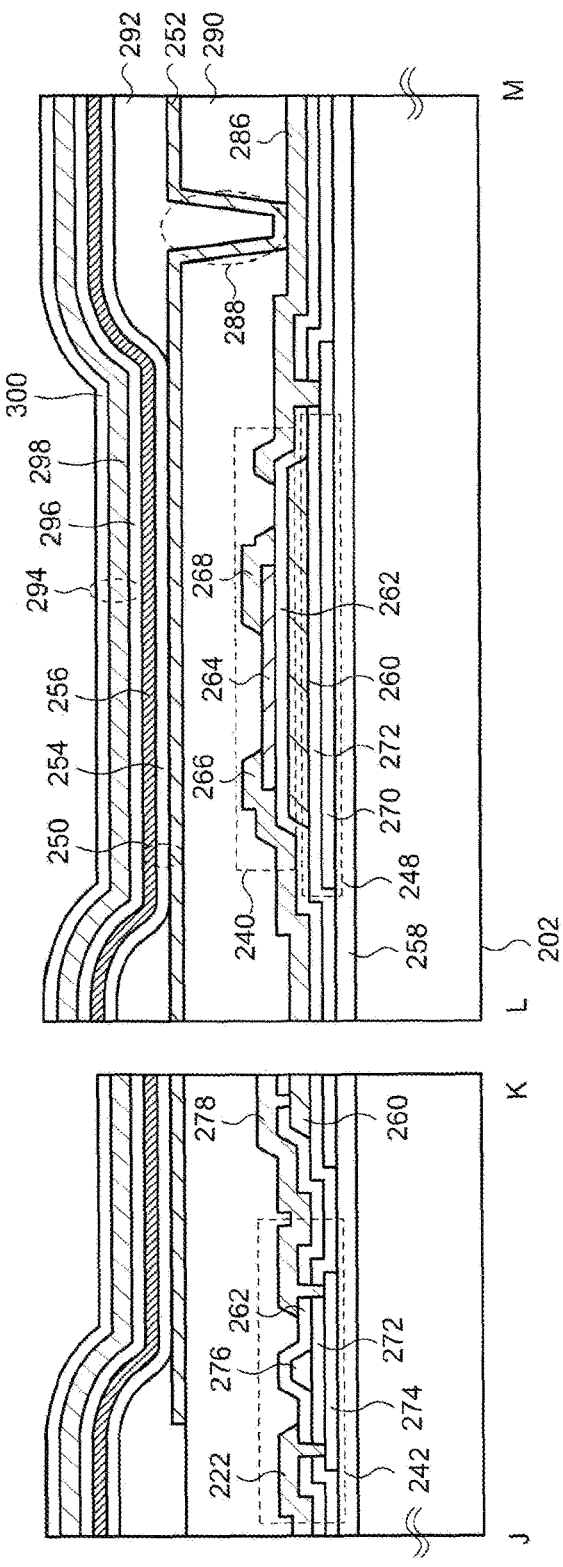
FIG. 9 is a schematic cross-sectional view of a display device according to an embodiment of the present invention.

A schematic top view of the pixel 204 is shown in FIG. 8, and schematic cross-sectional views along chain lines J-K and L-M are represented in FIG. 9. In FIG. 8, the display element 250 is not illustrated. In the pixel 204, the capacitor 248 and the first transistor 240 are stacked over the substrate 202 with an undercoat 258 sandwiched therebetween (see FIG. 9), and this structure corresponds to the semiconductor device 140. The first transistor 240 has the gate electrode 260, a gate insulating film 262 (not shown in FIG. 8) over the gate electrode 260, an oxide semiconductor film 264 over the gate insulating film 262, and the first terminal 266 and the second terminal 268 over the oxide semiconductor film 264. The capacitor 248 has the first electrode 270, an insulating film 272 (not shown in FIG. 8) located over the first electrode 270 and functioning as a dielectric, and the gate electrode 260 over the insulating film 272, and the gate electrode 260 is shared by the first transistor 240 and the capacitor 248. The capacitor 248 corresponds to the capacitor 150 of the semiconductor device 140.

The second transistor 242 has a semiconductor film 274 over the undercoat 258 over which the insulating film 272 functioning as a gate insulating film of the second transistor 242 is provided. The insulating film 272 functions as a gate insulating film in the third transistor 244 and the fourth transistor 246 and also shared by the capacitor 248 to serve as the dielectric in the capacitor 248.

The second transistor 242 further possesses the gate electrode 276 over the semiconductor film 274 and the insulating film 272, and the gate electrode 276 corresponds to a part of the first scanning line 220 (a portion protruding upward in FIG. 8). The gate insulating film 262 of the first transistor 240 extends over and covers the gate electrode 276 of the second transistor 242 and functions as an interlayer film in the second transistor 242. The image-signal line 222 and the second terminal 278 are provided so as to cover contact holes (dotted circles in FIG. 8. The same is applied hereinafter) formed in the gate insulating film 262 and the insulating film 272 and electrically connected to the semiconductor film 274. Therefore, the image-signal line 222 also functions as the first terminal of the second transistor 242. The second terminal 278 is electrically connected, through a contact hole, to the gate electrode 260 of the first transistor 240 which also functions as the one electrode of the capacitor 248 (see, FIG. 9).

The third transistor 244 has a semiconductor film 280, and a part of the second scanning line 226 (a portion protruding downward in FIG. 8) functions as the gate electrode. The semiconductor film 280 is electrically connected to the current-supplying line 224 and the second terminal 282 through contact holes formed thereover. Hence, the current-supplying line 224 further functions as the first terminal of the third transistor 244. Additionally, the second terminal 282 also serves as the first terminal 266 of the first transistor 240.

The fourth transistor 246 has a semiconductor film 284, and a part of the third scanning line 228 (a portion protruding upward in FIG. 8) functions as the gate electrode. The semiconductor film 284 is electrically connected to the reset power-source line 230 and the second terminal 286 in contact holes formed thereover. The second terminal 286 also serves as the second terminal 268 of the first transistor 240. Additionally, the second terminal 286 is connected to the pixel electrode 252 in a contact hole 288 formed thereover.

As described in the First and Second Embodiments, the first transistor 240 possesses the semiconductor film 264 including an oxide semiconductor. On the other hand, there is no limitation to an element included in the semiconductor films 274, 280, and 284 of the second transistor 242, the third transistor 244, and the fourth transistor 246, and silicon, germanium, an oxide semiconductor, or the like may be included. Crystallinity of the oxide semiconductor film 264 and the semiconductor films 274, 280, and 284 is not limited and may be single crystalline, polycrystalline, microcrystalline, or amorphous.

The structures of the second transistor 242, the third transistor 244, and the fourth transistor 246 are not limited and may be a top-gate type or a bottom-gate type. Furthermore, positional relationships of the semiconductor films 274, 280, and 284 of the second transistor 242, the third transistor 244, and the fourth transistor 246 with respect to the first terminals and the second terminals connected thereto are not limited and may be a bottom-contact type or a top-contact type. In each of the second transistor 242, the third transistor 244, and the fourth transistor 246, the first terminal and the second terminal may overlap with the gate electrode or form a so-called self-aligned structure in which the first terminal and the second terminal do not overlap with the gate electrode. It is not necessary that only a single gate electrode is provided, and the second transistor 242, the third transistor 244, and the fourth transistor 246 may have a multi-gate structure having two or more gate electrodes.

A leveling film 290 is provided over the first transistor 240 and the second transistor 242 (FIG. 9) and absorbs depressions, projections, and inclines caused by the capacitor 248, the first transistor 240, and the second transistor 242 to give a flat top surface. The contact hole 288 is formed in the leveling film 290, and the pixel electrode 252 is electrically connected to the second terminal 268 of the first transistor 240 and the second terminal 286 of the fourth transistor 246 in the contact hole 288.

A partition wall 292 covering an edge portion of the pixel electrode 252 and absorbing depressions and projections caused by the contact hole 288 is formed over the pixel electrode 252. The EL layer 254 and the opposing electrode 256 are arranged over the pixel electrode 252 and the partition wall 292, and the display element 250 is structured by the pixel electrode 252, the EL layer 254, and the opposing electrode 256. In the present specification and claims, the EL layer 254 means all the layers sandwiched between the pixel electrode 252 and the opposing electrode 256. Carriers (electrons and holes) are injected to the EL layer 254 from the pixel electrode 252 and the opposing electrode 256, and light emission is obtained through a process in which an excited state generated by carrier recombination relaxes to a ground state.

The display device 200 may possess a passivation film (sealing film) 294 over the opposing electrode 256 as an optional structure. In the present embodiment, the passivation film 294 has a three-layer structure including a first layer 296, a second layer 298, and a third layer 300 as shown in FIG. 9. Specifically, the passivation film 294 has the first layer 296 including an inorganic insulator, the second layer 298 including an organic insulator, and the third layer 300 including an inorganic insulator. The passivation film 294 may have a single-layer structure or may be structured with a plurality of layers as illustrated.

Since a transistor including an oxide semiconductor has a low filed-effect mobility compared with a transistor including a silicon semiconductor, it is generally difficult to flow a large current in a transistor including an oxide semiconductor. However, similar to the semiconductor device 140 described in the Second Embodiment, the capacitor 248 and the first transistor 240 are stacked with each other in the display device 200 of the present embodiment. With this stacked structure, it is not required to enlarge the pixel 204 even if a size of the first transistor 240 is increased because the capacitor 248 occupies a large area in the pixel 204. Therefore, it is possible to secure a large channel width in the first transistor 240 without decreasing an aperture ratio and resolution of display, by which a large current can be flowed. Since the second transistor 242 is connected to the display element 250, a large current can be flowed in the display element 250, thereby enabling display at a high luminance.

As described above, since the first transistor 240 is connected to the display element 250 in series, variation in electric characteristics (threshold voltage) of the first transistor 240 influences variation in luminance between the pixels 204, resulting in a reduction of display quality. However, variation in characteristics of a transistor having an oxide semiconductor is smaller than that of a transistor including a silicon transistor, particularly that of a transistor including polycrystalline silicon (polysilicon). Hence, application of the first transistor 240 shown in the present embodiment to the transistor connected to the display element 250 allows production of a display device with high display quality.

Moreover, as described above, the insulating film 272 serving as the dielectric of the capacitor 248 also functions as the gate insulating film in the second transistor 242, the third transistor 244, and the fourth transistor 246. A thickness of a gate insulating film of a transistor is generally as small as 50 nm to 100 nm. Thus, the capacitor 248 is able to possess a large capacitance. Accordingly, it is possible to maintain the potential of the gate electrode 260 of the first transistor 240 for a long time, and a writing frequency of the image signal Vsig from the image-signal line 222 can be significantly decreased, thereby reducing power consumption.

Furthermore, as described in the First and Second Embodiments, the parasitic capacitance formed by the first terminal 266 and the gate electrode 260 of the first transistor 240 is small. Hence, as explained below, it is possible to suppress a decrease in luminance and an image-persisting phenomenon caused by the parasitic capacitance formed by the first terminal 266 and the gate electrode 266. Hereinafter, for the sake of convenience, explanation is provided for the case where the first terminal 266 and the second terminal 268 of the first transistor 240 shown in FIG. 7 and FIG. 8 are a drain and a source, respectively.

As described above, the second transistor 242 is turned off after the image signal Vsig is written to the gate electrode 260 of the first transistor 240, by which the gate electrode 260 of the first transistor 240 becomes a floating state. Since a current flowing between the drain 266 and the source 268 of the first transistor 240 flows in the display element 250, the potential of the source 268 increases. Therefore, the potential of the gate electrode 260 of the first transistor 240 also increases due to the bootstrap operation. Ideally, an increase of the potential of the source 268 is the same as an increase of the potential of the gate electrode 260.

Figure 10A:
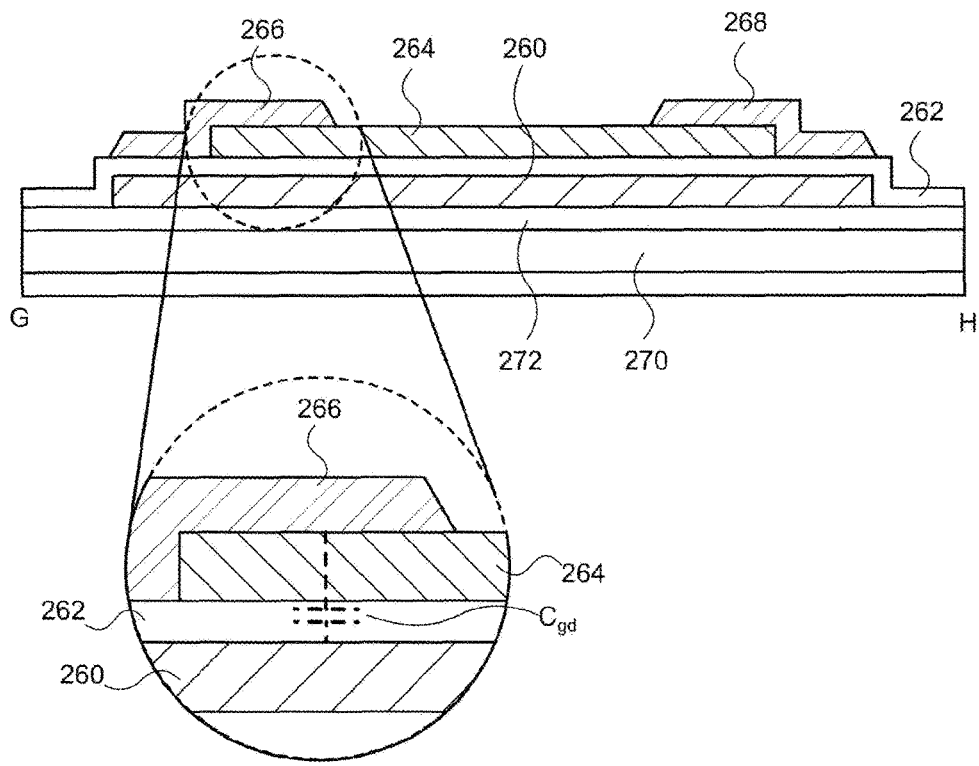
FIG. 10A and FIG. 10B are drawings for explaining an image-persisting phenomenon of a display element.

However, as indicated in the equivalent circuit of FIG. 7 and the cross-sectional view of FIG. 10A, a parasitic capacitance $C_{gd}$ exists between the gate electrode 260 and the drain 266. This $C_{gd}$ reduces the increase of the potential of the gate electrode 260 compared with that of the source 268. This phenomenon is called a bootstrap loss (BS loss). At this time, a decrease $\Delta V_{gs}$ of the potential difference $V_{gs}$ between the gate electrode 260 and the source 268 follows the following equation:

$$\Delta V_{gs} = \Delta V_s \times \frac{C_{gd}}{C_{gd} + C_s}$$

where $\Delta V_s$ is the increase of the potential of the source 268, and $C_s$ is a capacitance of the capacitor 248. According to this equation, the BS loss is 0 when $C_{gd}$ is 0, and the potential difference between the gate electrode 260 and the source 268 is maintained ($\Delta V_{gs}=0$). On the other hand, an increase in $C_{gd}$ leads to an increase of $\Delta V_{gs}$ and the BS loss. As a result, although a sufficient potential difference is provided between the gate electrode 260 and the source 268 at an early stage of the emission, the potential difference between the gate electrode 260 and the source 268 decreases before the emission reaches a stationary state ($\Delta V_{gs}>0$). Accordingly, a potential of the pixel electrode 252 cannot sufficiently increase to obtain an intended luminance.

However, similar to the First and Second Embodiments, a width of the drain 266 of the first transistor 240 is smaller than that of the source 268 in the display device 200. Hence, $C_{gd}$ can be significantly reduced and the BS loss can be decreased, by which an intended luminance or a luminance substantially the same as the intended luminance can be obtained.

Figure 10B:
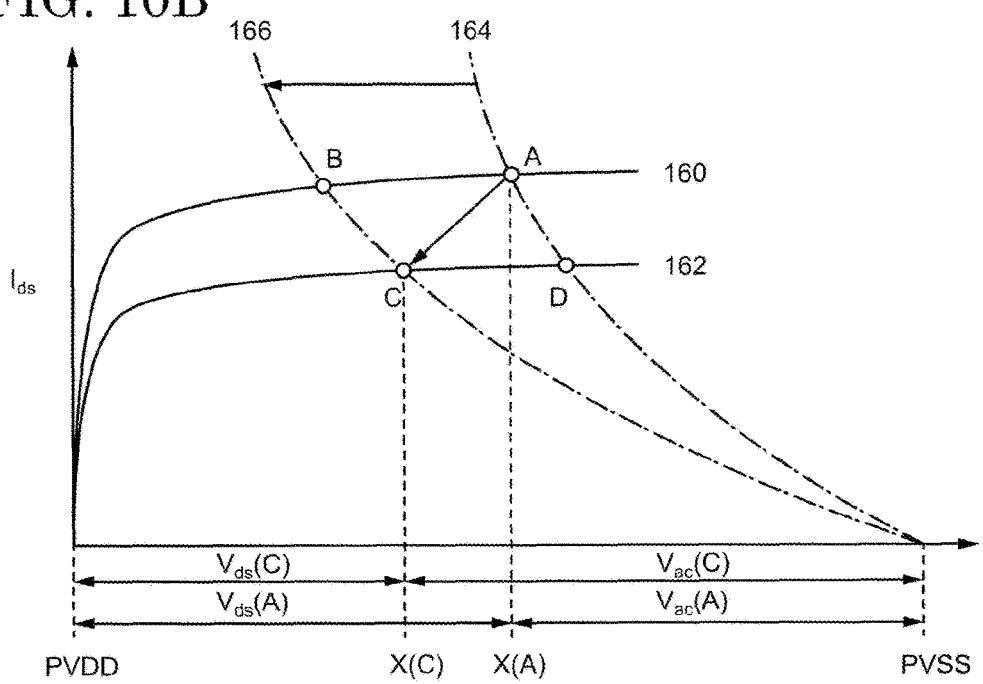

Explanation with respect to the image-persisting phenomenon of the display element 250 is given by using FIG. 10B. Curves 160 and 162 of the graph schematically represent V-I curves of the first transistor 240, and a current $I_{ds}$ flowing between the drain 266 and the source 268 with respect to a potential difference $V_{ds}$ between the drain 266 and the source 268 is plotted when a constant potential is provided between the gate electrode 260 and the source 268. The curve 160 is a V-I curve when the BS loss is small. In this case, a relatively large potential difference is maintained between the gate electrode 260 and the source 268 due to the bootstrap operation. On the other hand, the curve 162 is a V-I curve when the BS loss is large. Compared with the case where the BS loss is small, the potential difference between the gate electrode 260 and the source 268 is small. Therefore, in the case where $V_{ds}$ is the same, a large current $I_{ds}$ flows when the BS loss is small (curve 160).

Curves 164 and 166 schematically represent V-I curves of the display element 250. That is, these curves are plots of a current flowing in the EL layer 254 with respect to a potential difference applied between the pixel electrode 252 and the opposing electrode 256. The curves 164 and 166 are V-I curves of the display element 250 before and after deterioration, respectively. As shown in FIG. 10B, the curves 160 and 162 start from the high potential PVDD. Furthermore, the curves 164 and 166 start from the low potential PVSS. Since the display element 250 and the first transistor 240 are connected in series, the current amount is the same. Accordingly, intersections of the curve 160 with the curves 164 and 166 and intersections of the curve 162 with the curves 164 and 166 are operation points of the display device 250. The potential of the node X is a potential X(C) and a potential X(A) at the intersections C and A, respectively. At the intersection C, the source-drain voltage of the first transistor 240 is a voltage $V_{ds}(C)$, and the anode (pixel electrode 252)-cathode (opposing electrode 256) voltage of the display element 250 is $V_{ac}(C)$. At the intersection A, the source-drain voltage of the first transistor 240 is a voltage $V_{ds}(A)$, and the anode-cathode voltage of the display element 250 is $V_{ac}(A)$.

In the case where the BS loss is small, the operation point of the display element 250 is the intersection A of the curve 160 with the curve 164 before deterioration of the display element 250. Since $I_{ds}$ is the same as the current following in the display element 250, the luminance of the display element 250 is determined by the product of the current at the intersection A by current efficiency of the display element 250.

When the display element 250 is deteriorated and the V-I characteristic shifts to the curve 166, the operation point of the display element 250 shifts to the intersection B in the case where the BS loss is small. In this case, a decrease of $I_{ds}$ due to a decrease of $V_{ds}$ can be suppressed by driving the first transistor 240 in a saturated region. Hence, a reduction in luminance can be suppressed to some extent even if the display element 250 is deteriorated as long as a remarkable decrease in current efficiency does not occur.

On the contrary, when the BS loss is large, the V-I curve shifts to the curve 162. Accordingly, when the display element 250 is deteriorated and the V-I characteristic shifts to the curve 166, the operation point shifts to the intersection C, and $I_{ds}$, i.e., the current flowing in the display element 250, is significantly decreased. As a result, the luminance is drastically decreased, which is recognized as the image-persisting phenomenon. Furthermore, when the BS loss is large, the V-I curve shifts to the curve 162. Thus, the operation point shifts to the intersection D, and $I_{ds}$ is also enormously decreased. Hence, the luminance is markedly decreased, which is recognized as the image-persisting phenomenon.

As described above, the BS loss greatly depends on $C_{gd}$. However, the width of the drain 266 of the first transistor 240 is smaller than that of the source 268 in the display device 200 of the present embodiment. Hence, $C_{gd}$ can be significantly decreased, by which the BS loss can be reduced. As a result, the decrease in luminance and the image-persisting phenomenon can be suppressed. Therefore, the application of the present embodiment allows production of a highly reliable display device capable of high-quality display.

Fourth Embodiment

In the present embodiment, explanation is given with respect to a manufacturing method of the display device 200 described in the Third Embodiment by using FIG. 9 and FIG. 11A to FIG. 15B. FIG. 11A to FIG. 11B are cross-sectional views along broken lines J-K and L-M of FIG. 8. Explanation of the structures the same as those of the First to Third Embodiment may be omitted.

1. Capacitor

First, the undercoat 258 is formed over the substrate 202 (FIG. 11A). The substrate 202 has a function to support a variety of semiconductor elements formed thereover. Therefore, a material having heat resistance to a process temperature of each semiconductor element formed thereover and chemical stability to chemicals used in the process may be used. Specifically, the substrate 202 may include glass, quartz, plastics, a metal, ceramics, and the like. When flexibility is provided to the display device 200, a polymer material can be used. For example, a polymer material exemplified by a polyimide, a polyamide, a polyester, and a polycarbonate can be employed. Note that, when a flexible display device 200 is fabricated, the substrate 202 may be called a base material or a base film.

The undercoat 258 is a film having a function to prevent impurities such as an alkaline metal from diffusing to each semiconductor element and the like from the substrate 202 and can include an inorganic insulator such as silicon nitride, silicon oxide, silicon nitride oxide, and silicon oxynitride. The undercoat 258 can be formed to have a single-layer or stacked-layer structure by applying a chemical vapor deposition method (CVD method), a sputtering method, a lamination method, and the like. When a CVD method is employed, tetraalkoxysilane and the like may be used as a raw material gas. A thickness of the undercoat 258 can be freely selected from a range from 50 nm to 1000 nm and is not necessarily constant over the substrate 202. The undercoat 258 may have different thicknesses depending on position. For instance, when the undercoat 258 is configured with a plurality of layers, a silicon nitride-containing layer may be stacked over the substrate 202, and then a silicon oxide-containing layer may be stacked thereover.

When an impurity concentration in the substrate 202 is low, the undercoat 258 may not be provided or may be formed to cover a part of the substrate 202. For example, when a polyimide having a low concentration of an alkaline metal is employed as the substrate 202, the undercoat 258 may not be provided.

Next, the semiconductor film 274 and the first electrode 270 are formed over the undercoat 258 (FIG. 11A). For example, amorphous silicon (a-Si) with a thickness of approximately 50 nm to 100 nm is formed over the undercoat 258 with a CVD method and is crystallized by performing a heating treatment or irradiation of light such as a laser to transform into a polysilicon film. The crystallization may be carried out in the presence of a catalyst such as nickel. After that, the polysilicon film is processed with etching to form the semiconductor film 274 and the first electrode 270. Although not shown, the semiconductor films 280 and 284 are formed simultaneously with the semiconductor film 274.

Next, the semiconductor film 274 is masked, and an ion-implantation treatment or an ion-doping treatment is conducted selectively on the first electrode 270. An element such as boron and aluminum imparting a p-type conductivity or an element such as phosphorus and nitrogen imparting an n-type conductivity is represented as an ion. With this process, a conductivity sufficient for the first electrode 270 to function as the one electrode of the capacitor 248 can be obtained.

Next, the insulating film 272 is formed over the semiconductor film 274 and the first electrode 270 (FIG. 11A). The insulating film 272 may have a single-layer structure or a stacked-layer structure and include an inorganic insulator usable in the undercoat 258. Alternatively, the insulating film 272 may contain an insulator with high permittivity such as hafnium oxide, zirconium oxide, aluminum oxide, or a mixed oxide thereof. Similar to the undercoat 258, the insulating film 272 can be formed by applying a sputtering method, a CVD method, or the like. The insulating film 272 functions as the dielectric film of the capacitor 248 in addition to functioning as the gate insulating films of the second transistor 242, the third transistor 244, and the fourth transistor 246.

Next, a metal film is formed over the insulating film 272 and subjected to processing with etching to form the gate electrode 276 of the second transistor 242 and the gate electrode 260 of the first transistor 240 (FIG. 11B). Thus, these electrodes exist in the same layer. In this case, the wirings existing in the same layer as these electrodes, e.g., the second scanning line 226, the third scanning line 238, and the like, are simultaneously formed. Areas and positions of the first electrode 270 and the gate electrode 260 may be adjusted so that the first electrode 270 is completely covered with the gate electrode 260 or a lower surface of the gate electrode 260 completely overlaps with the first electrode 270. With this structure, variation in capacitance caused by misalignment can be prevented.

The metal film can be formed by using a metal such as titanium, aluminum, copper, molybdenum, tungsten, and tantalum or an alloy thereof so as to have a single-layer or stacked layer structure. When the display device 200 of the present invention possesses a large area, the use of a metal with a high conductivity, such as aluminum and copper, is preferred in order to avoid signal delay. For example, a structure can be employed in which aluminum or copper is sandwiched by a metal having a relatively high melting-point, such as titanium and molybdenum.

Through the aforementioned processes, the capacitor 248 is fabricated.

2. Transistor

Next, the gate insulating film 262 is formed so as to cover the gate electrodes 260 and 276 (FIG. 12A). The gate insulating film 262 may have a single-layer structure or a stacked-layer structure. The gate insulating film 262 functions as the interlayer film in the second transistor 242, the third transistor 244, and the fourth transistor 246.

The gate insulating film 262 can be formed with the same method as that for the insulating film 272 and can include the same material as that for the insulating film 272. It is preferred to use a silicon oxide-containing insulating film in order to suppress carrier generation in the semiconductor film 264 formed thereover. When the gate insulating film 262 has a stacked structure, a region in contact with the semiconductor film 264 preferably contains silicon oxide.

When the gate insulating film 262 is formed, it is preferred that an atmosphere contain a hydrogen-containing gas such as hydrogen gas and water vapor as little as possible, by which the gate insulating film 262 with a small hydrogen composition and an oxygen composition close to or larger than stoichiometry can be formed.

After forming the gate insulating film 262, an ion-implantation treatment or an ion-doping treatment is performed on the semiconductor film 274 by using the gate electrode 276 as a mask. An element imparting a p-type conductivity, such as boron and aluminum, or an element imparting an n-type conductivity, such as phosphorus and nitrogen, is represented as an ion. This process allows the formation of a channel region in a region overlapping with the gate electrode 276 and a source/drain region in another region of the semiconductor film 274. Note that an ion-implantation treatment or an ion-doping treatment may be carried out on the third transistor 244 and the fourth transistor 246 as appropriate.

Next, the oxide semiconductor film 264 is formed over the gate insulating film 262 so as to overlap with the first electrode 270 and the gate electrode 260 (FIG. 12A). The oxide semiconductor film 264 may include an oxide semiconductor which can be selected from Group 13 elements such as indium and gallium. The semiconductor film 264 may include a plurality of different Group 13 elements and may be indium-gallium-oxide (IGO). The semiconductor film 264 may further contain Group 12 elements and is exemplified by indium-gallium-zinc-oxide (IGZO). The semiconductor film 264 may include Group 14 elements such as tin or Group 4 elements such as titanium and zirconium.

The semiconductor film 264 is formed by utilizing a sputtering method and the like at a thickness of 20 nm to 80 nm or 30 nm to 50 nm. When a sputtering method is applied, the film formation can be conducted under an atmosphere containing oxygen gas, such as a mixed atmosphere of argon and oxygen gas. In this case, a partial pressure of argon may be lower than that of oxygen gas.

The oxide semiconductor film 264 preferably possesses few crystal defects such as an oxygen defect. Hence, it is preferred to perform a heat treatment (annealing) on the oxide semiconductor film 264. The heat treatment may be conducted before patterning or after patterning the oxide semiconductor film 264. It is preferred that the heat treatment be performed before the patterning because the oxide semiconductor film 264 may decrease in volume (shrinking) by the heat treatment. The heat treatment may be conducted in the presence of nitrogen, dry air, or atmospheric air at a normal pressure or a reduced pressure. The heating temperature can be selected from a range of 250° C. to 500° C. or 350° C. to 450° C., and the heating time can be selected from a range of 15 minutes to 1 hour. However, the heat treatment can be conducted outside these temperature and time ranges. Oxygen is introduced or migrated to the oxygen defects of the oxide semiconductor film 264 by the heat treatment, which results in the oxide semiconductor film 264 having a well-defined structure, a small number of crystal defects, and high crystallinity. Accordingly, the first transistor 240 having high reliability and excellent electrical properties such a low off current and small variation in characteristics (threshold voltage).

Next, as shown in FIG. 12B, the insulating film 272 and the gate insulating film 262 are processed with etching to form opening portions exposing the semiconductor film 274 and the first electrode 270. After that, the image-signal line 222, the second terminal 278 of the second transistor 242, the first terminal 266 and the second terminal 268 of the first transistor 240, the second terminal 286 of the fourth transistor 246, and the like are formed (FIG. 13A). Therefore, these terminals and wirings exist in the same layer. These terminals and wirings can be formed by applying a similar material, structure, and method to those for the formation of the gate electrode 260 and the first electrode 270 of the capacitor 248. Note that a thickness of the oxide semiconductor film 264 in the channel region may be smaller than that in a region covered by the first terminal 266 or the second terminal 268. Although not shown, an insulating film for protecting the channel region may be provided between the oxide semiconductor film 264 and the first terminal 266 and the second terminal 268.

With the above processes, the first transistor 240 and the second transistor 242 are fabricated as well as the third transistor 244 and the fourth transistor 246.

3. Display Element

Next, the leveling film 290 is formed so as to cover the first transistor 240 and the second transistor 242 (FIG. 13B). The leveling film 290 can be formed by using an organic insulator. A polymer material such as an epoxy resin, an acrylic resin, a polyimide, a polyamide, a polyester, a polycarbonate, and a polysiloxane is represented as an organic insulator, and the leveling film 290 can be formed with a wet-type film-forming method such as a spin-coating method, an ink-jet method, a printing method, and a dip-coating method. The leveling film 290 may have a stacked structure including a layer containing the aforementioned organic insulator and a layer containing an inorganic insulator. In this case, a silicon-containing inorganic insulator such as silicon oxide, silicon nitride, silicon nitride oxide, and silicon oxynitride is represented as an inorganic insulator, and the layer containing an inorganic insulator can be formed with a sputtering method or a CVD method.

Figure 14A:
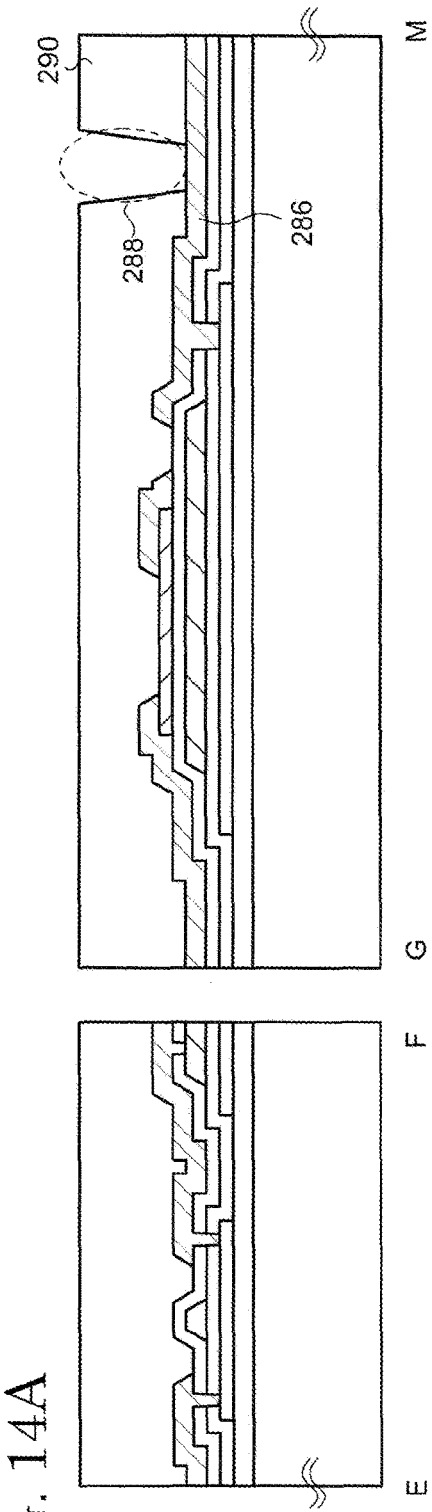
FIG. 14A and FIG. 14B are schematic cross-sectional views showing a manufacturing method of a display device according to an embodiment of the present invention.
Figure 14B:
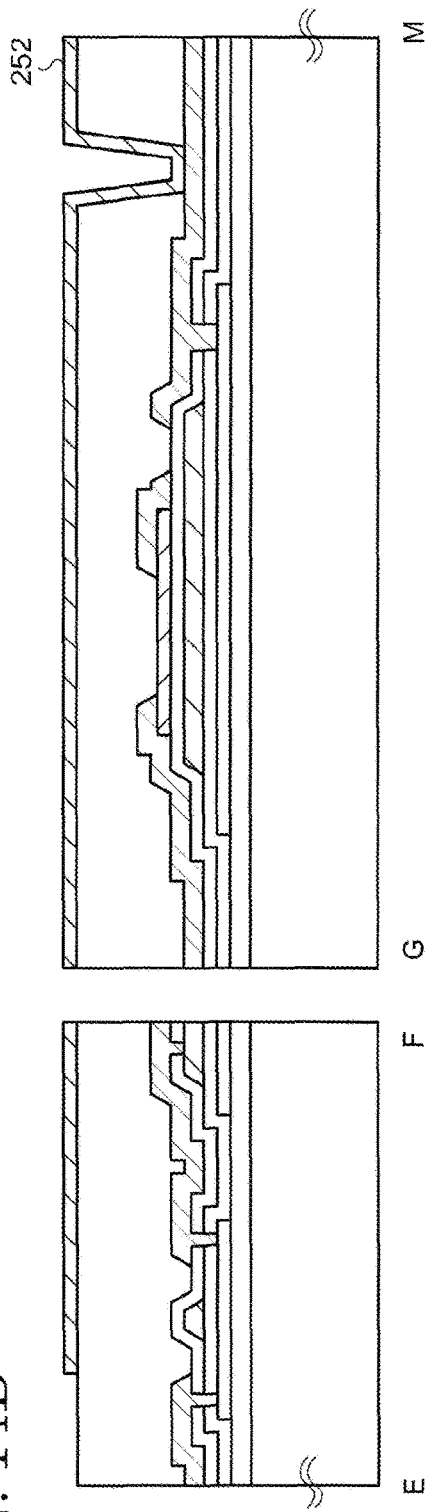

Next, the leveling film 290 is processed to form the contact hole 288 (FIG. 14A). After that, the pixel electrode 252 is formed so as to cover the contact hole 288 (FIG. 14B), by which the pixel electrode 252 and the second terminal 268 of the first transistor 240 are electrically connected to each other.

When light emission from the display element 250 is extracted through the substrate 202, a material having a light-transmitting property, such as a conductive oxide exemplified by indium-tin-oxide (ITO) and indium-tin-zinc-oxide (IZO), can be used for the pixel electrode 252. On the other hand, when the light emission from the display element 250 is extracted from a side opposite to the substrate 202, a metal such as aluminum and silver or an alloy thereof can be used. Alternatively, a stacked layer of the aforementioned metal or alloy and the conductive oxide can be employed. For example, a stacked structure in which a metal is sandwiched by a conductive oxide (e.g., ITO/silver/ITO etc.) can be used.

Next a partition wall 292 is formed (FIG. 15A). The partition wall 292 can be formed by using a material usable in the leveling film 290 with a wet-type film-forming method. The partition wall 292 has an opening portion so as to expose a part of the pixel electrode 252, and an edge portion of the opening preferably has a moderately tapered shape, thereby preventing generation of a defect in the EL layer 254 and the opposing electrode 256 formed later. The partition wall 292 also has a function to absorb steps caused by the pixel electrode 252 and the contact hole 288 as well as a function to electrically insulate the pixel electrodes 252 of the adjacent pixels 204 from each other. The partition wall 292 is also called a bank or a rib.

Next, the EL layer 254 is formed over the pixel electrode 252 (FIG. 15B). The EL layer 254 is formed so as cover the pixel electrode 252 and the partition wall 292. The EL layer 254 may be structured by a single layer or a plurality of layers. For example, the EL layer 254 can be structured by appropriately combining a carrier-injection layer, a carrier-transporting layer, an emission layer, a carrier-blocking layer, an exciton-blocking layer, and the like. Moreover, the EL layer 254 may be different in structure between adjacent pixels 204. For example, the EL layer 254 may be formed so that the emission layer is different but other layers are the same in structure between the adjacent pixels 204. With this structure, different emission colors can be obtained from the adjacent pixels 204, and full color display can be realized. On the contrary, the same EL layer 254 may be used in all pixels 204. In this case, the EL layer 254 giving white emission may be formed so as to be shared by all pixels 204, and the wavelength of the light extracted from each pixel 204 may be selected by using a color filter and the like. The EL layer 254 can be formed by applying an evaporation method or the aforementioned wet-type film-formation method.

Next, the opposing electrode 256 is formed over the EL layer 254 (FIG. 15B). When the light emission from the display element 250 is extracted through the substrate 202, a metal such as aluminum and silver or an alloy thereof can be used for the opposing electrode 256. On the other hand, when the light-emission from the display element 250 is extracted through the opposing electrode 256, the opposing electrode 256 is formed by using the aforementioned metal or alloy so as to have a thickness which allows visible light to pass therethrough. Alternatively, a material having a light-transmitting property, such as a conductive oxide exemplified by ITO, IZO, and the like, can be used for the opposing electrode 256. Furthermore, a stacked structure of the aforementioned metal or alloy with the conductive oxide (e.g., MG-Ag/ITO, etc.) can be employed in the opposing electrode 256. The opposing electrode 256 can be formed with an evaporation method, a sputtering method, and the like.

With the above processes, the display element 250 is fabricated.

A passivation film 294 may be disposed over the opposing electrode 256 as an optional structure (FIG. 9). One of the functions of the passivation film 294 is to prevent water from entering the precedently prepared display element 250 from outside. The passivation film 294 is preferred to have a high gas-barrier property. For example, it is preferred that the passivation film 294 be formed by using an inorganic material such as silicon nitride, silicon oxide, silicon nitride oxide, and silicon oxynitride. Alternatively, an organic resin including an acrylic resin, a polysiloxane, a polyimide, a polyester, and the like may be used. The passivation film 294 may have a single-layer structure or a stacked-layer structure.

When the passivation film 294 has the three-layer structure including the first layer 296, the second layer 298, and the third layer 300, the first layer 296 may include an inorganic insulator such as silicon oxide, silicon nitride, silicon nitride oxide, and silicon oxynitride and may be formed by applying a CVD method or a sputtering method. As a material for the second layer 298, a polymer material selected from an epoxy resin, an acrylic resin, a polyimide, a polyester, a polycarbonate, a polysiloxane, and the like can be used. The second layer 298 can be formed with the aforementioned wet film-forming method. Alternatively, the second layer 298 may be formed by atomizing or gasifying oligomers functioning as a raw material of the polymer material at a reduced pressure, spraying the first layer 296 with the oligomers, and polymerizing the oligomers. At this time, a polymerization initiator may be mixed in the oligomers. Additionally, the first layer 296 may be sprayed with the oligomers while cooling the substrate 202. The third layer 300 can be formed by applying the same material and method as those for the first layer 296.

Figure 5:
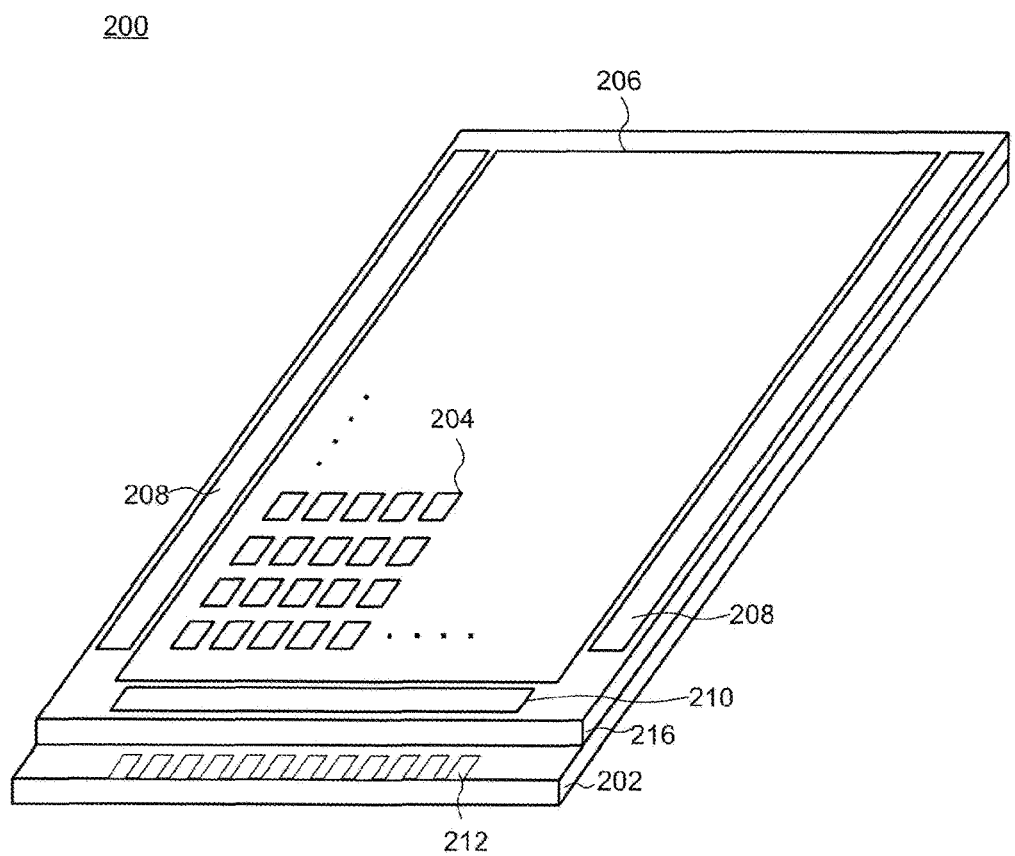
FIG. 5 is a perspective view of a display device according to an embodiment of the present invention.

The opposing substrate 216 may be arranged over the passivation film 294 as an optional structure (see, FIG. 5). The opposing substrate 216 is fixed to the substrate 202 with an adhesive (not shown). In this case, a space between the opposing substrate 216 and the passivation film 294 may be filled with an inert gas or a filler such as a resin. Alternatively, the passivation film 294 and the opposing substrate 216 may be directly adhered with an adhesive. When the opposing substrate 216 is fixed to the substrate 202, a gap therebetween may be adjusted by adding a spacer in the adhesive or the filler. Alternatively, a structure functioning as a spacer may be formed between the pixels 204.

Furthermore, a light-shielding film having an opening in a region overlapping with the emission region and a color filter in a region overlapping with the emission region may be disposed over the opposing substrate 216. The light-shielding film is formed by using a metal with a relatively low reflectance, such as chromium and molybdenum, or a mixture of a resin material with a coloring material having a black or similar color. The light-shielding film has a function to shield scattered or reflected external light and the like other than the light directly obtained from the emission region. The color filter can be formed while changing its optical properties between adjacent pixels 204 so that red emission, green emission, and blue emission are extracted. The light-shielding film and the color filter may be provided over the opposing substrate 216 with an undercoat film interposed therebetween, and an overcoat layer may be further arranged to cover the light-shielding film and the color filter.

Through the above processes, the display device 200 described in the Third Embodiment is manufactured.

Fifth Embodiment

Figure 16:
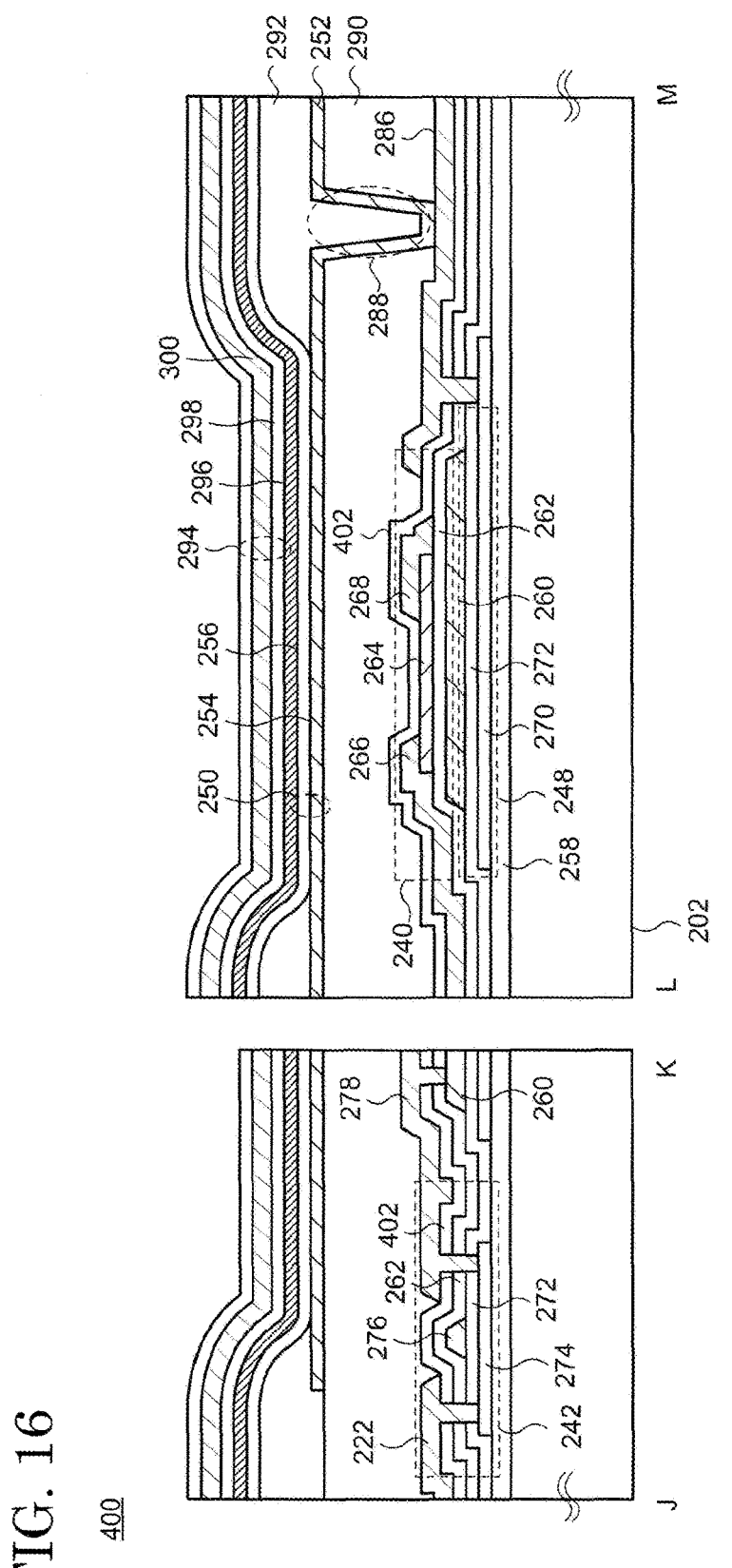
FIG. 16 is a schematic cross-sectional view of a display device according to an embodiment of the present invention.

In the present embodiment, a display device 400 according to an embodiment of the present invention is explained by using FIG. 8 and FIG. 16. Explanation of the contents duplicated in the First to Fourth Embodiments may be omitted.

Schematic cross-sectional views of the display device 400 are shown in FIG. 16. FIG. 16 corresponds to the cross-sections along the chain lines J-K and L-M in FIG. 8. A difference from the display device 200 is that the display device 400 possesses, over the first transistor 240, a second insulating film 402 in contact with the first terminal 266, the second terminal 268, and the oxide semiconductor film 264. The second insulating film 402 extends to the second transistor 242 and to the third transistor 244 and the fourth transistor 246 which are not illustrated and is sandwiched between the image-signal line 222 and the gate insulating film 262 and between the second terminal 278 and the gate insulating film 262 in the second transistor 242.

The second insulating film 402 may contain the same material as that of the gate insulating film 262 and can be formed by applying the same formation method as that for the gate insulating film 262. Similar to the gate insulating film 262, it is also preferred that the second insulating film 402 contain silicon oxide in order to suppress carrier generation in the oxide semiconductor film 264.

In the present embodiment, the first terminal 266 and the second terminal 268 are formed over the oxide semiconductor film 264, and then the second insulating film 402 is formed before forming the image-signal line 222 serving as the first terminal of the second transistor 242 and the second terminal 278. Next, the insulating film 272, the gate insulating film 262, and the second insulating film 402 are simultaneously subjected to etching processing to form opening portions exposing the semiconductor film 274, and the image-signal line 222 and the second terminal 278 are formed in the opening portions.

The use of the structure described in the present embodiment enables prevention of disappearance and contamination of the oxide semiconductor film 264 when the opening portions are formed in the insulating film 272, the gate insulating film 262, and the second insulating film 402. Furthermore, in the case where an oxide film, which is formed on a surface of the semiconductor film 274 after being exposed, is removed with a strong acid such as hydrofluoric acid, the oxide semiconductor film 264 is prevented from being lost or contaminated.

Similar to the display device 200, the first transistor 240 having the oxide semiconductor film 264 is connected to the display element 250 in the display device 400. Therefore, display variation between the pixels 204 can be reduced, and a display device having high display quality can be obtained because of small variation in characteristics of a transistor bearing an oxide semiconductor. Furthermore, the capacitor 248 and the first transistor 240 are stacked with each other, which enables the size of the first transistor 240 to be increased by utilizing the large size of the capacitor 248. Hence, the first transistor 240 is capable of having a large channel width, by which a large current can be flowed in the display element 250 and display can be performed at a high luminance. Accordingly, it is possible to maintain the potential of the gate electrode 260 of the first transistor 240 for a long time, allowing a writing frequency of the image signal Vsig from the image-signal line 222 to be significantly reduced and power consumption to be decreased. Additionally, as described in the First and Second Embodiments, the parasitic capacitance between the gate electrode 260 and the first terminal 266 of the first transistor 240 is small. Thus, a reduction in luminance and the image-persisting phenomenon caused by the parasitic capacitance can be suppressed.

Sixth Embodiment

In the present embodiment, a display device 500 according to an embodiment of the present invention is explained by using FIG. 5 to FIG. 7 and FIG. 17. Explanation of the contents duplicated in the First to Fifth Embodiments may be omitted.

Figure 17:
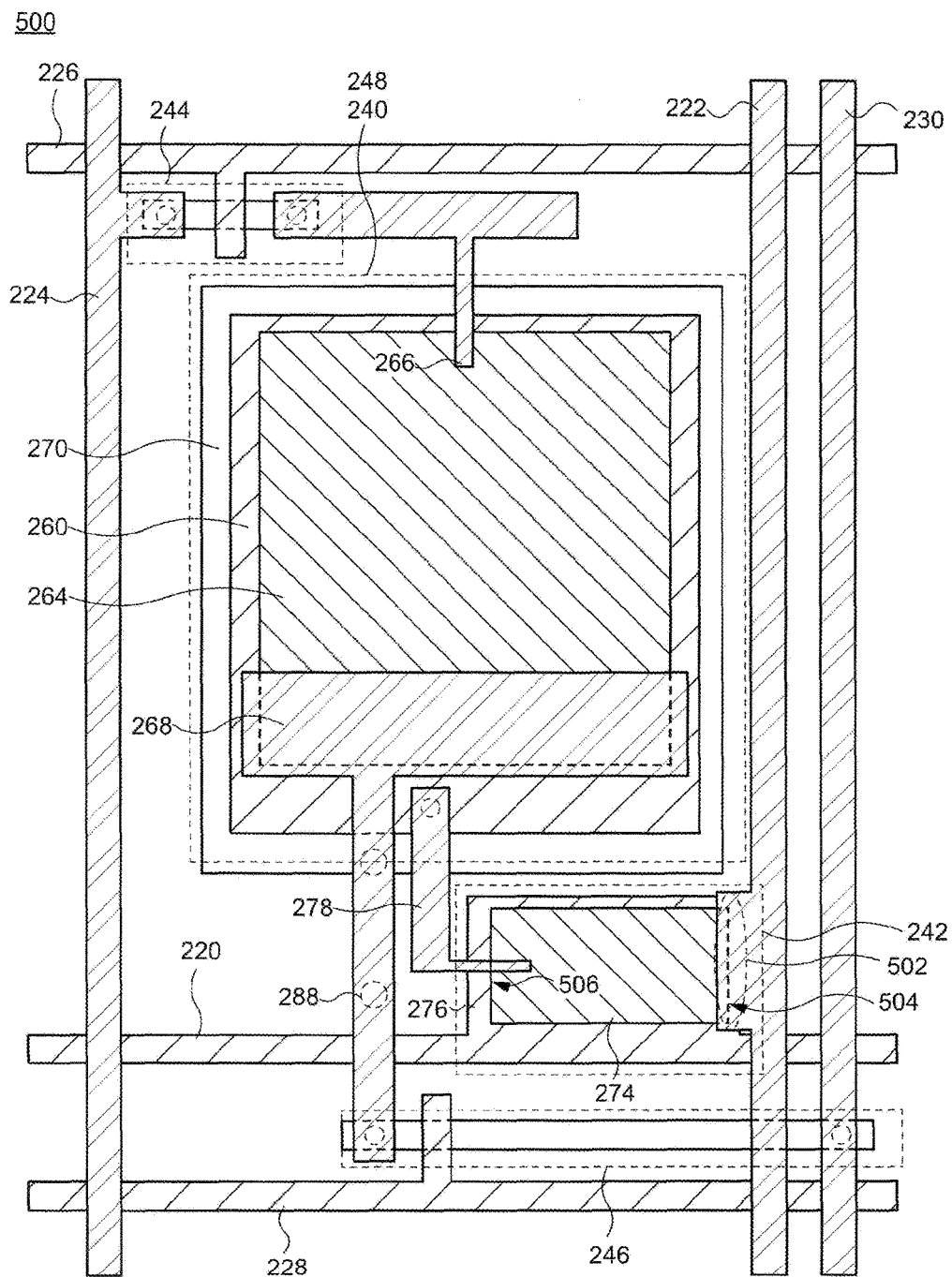
FIG. 17 is a schematic top view of a pixel of a display device according to an embodiment of the present invention.

Similar to the display device 200, the display device 500 also possesses the plurality of pixels 204 (FIG. 5 and FIG. 6). As shown in FIG. 17, the display device 500 is different in structure of the second transistor 242 from the display device 200, and the second transistor 242 has the same structure as that of the semiconductor device 100 of the First Embodiment. Specifically, a width of the first terminal 502 of the second transistor 242 is larger than a width of the second terminal 278. Namely, in the second transistor 242, a region in which the first terminal 502 overlaps with the gate electrode 276 is larger than a region in which the second terminal 278 overlaps with the gate electrode 276. In other words, a region in which the first terminal 502 overlaps with the semiconductor film 274 is larger than a region in which the second terminal 278 overlaps with the semiconductor film 274. Hence, when a side of the semiconductor film 274 overlapping with the first terminal 502 is a first side 504 and a side opposing the first side 504 and overlapping with the second terminal 278 is a second side 506, a portion of the first side 504 overlapping with the first terminal 502 is longer than a portion of the second side 506 overlapping with the second terminal 278. The region in which the first terminal 502 overlaps with the semiconductor film 274 may be twice to twenty times, three times to ten times, or five times to ten times the region in which the second terminal 278 overlaps with the semiconductor film 274.

In the second transistor 242 having such a structure, a large channel width can be maintained, and the parasitic capacitance formed between at least one terminal (second terminal 278 in an example shown in the present embodiment) and the gate electrode 276 can be reduced. Since the parasitic capacitance of the second transistor 242 also influences the luminance and the image-persisting phenomenon of the display element 250, the application of this embodiment enables suppression of these phenomena.

Additionally, the semiconductor film 274 of the second transistor 242 can be formed with an oxide semiconductor film. Fabrication of the semiconductor film 274 of the second transistor 242 with an oxide semiconductor film allows the potential of the gate electrode 260 of the first transistor 240 to be maintained for a long time because of the low off-current of a transistor having an oxide semiconductor in a channel region. Therefore, a writing frequency of the Seventh Embodiment In the present embodiment, a display device 600 according to an embodiment of the present invention is explained by using FIG. 5 to FIG. 7 and FIG. 18. Explanation of the contents duplicated in the First to Sixth Embodiments may be omitted.

Figure 18:
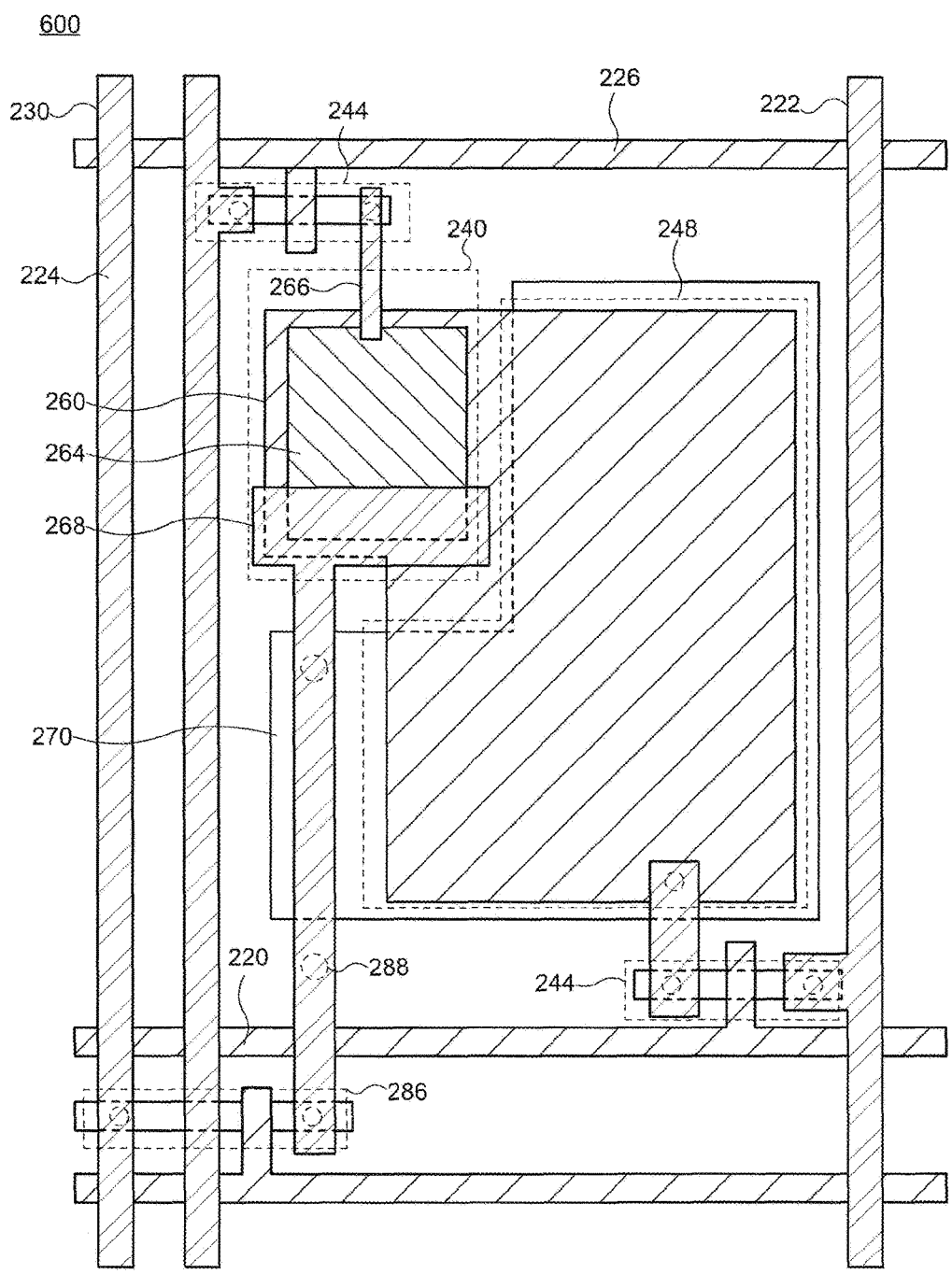
FIG. 18 is a schematic top view of a pixel of a display device according to an embodiment of the present invention.

Similar to the display device 200, the display device 600 also possesses the plurality of pixels 204 (FIG. 5 and FIG. 6). As shown in FIG. 18, the display device 600 is different from the display device 200 in that the first transistor 240 and the capacitor 248 are not stacked with each other. Specifically, the oxide semiconductor film 264 of the first transistor 240 overlaps with a film including the gate electrode 260 but does not overlap with the first electrode 270 of the capacitor 248. Other structures are substantially the same as those of the display device 200, and the first transistor 240 has the same structure as that of the semiconductor device 100.

The application of such a structure enables a reduction in display variation between the pixels 204 and production of a display device with high display quality, resulting from the small variation in characteristics of a transistor having an oxide semiconductor. Additionally, the first transistor 240 maintains a large channel width and possesses a small parasitic capacitance between the gate electrode 260 and the first terminal 266. Hence, it is possible to suppress a reduction in luminance and the image-persisting phenomenon caused by the parasitic capacitance.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
a plurality of pixels, at least one of the plurality of pixels including:
a first transistor comprising:
a gate electrode;
a gate insulating film over the gate electrode;
an oxide semiconductor film over the gate insulating film; and
a first terminal and a second terminal electrically connected to the oxide semiconductor film;
a capacitor under the first transistor, the capacitor including:
a first electrode;
an insulating film over the first electrode; and
the gate electrode over the insulating film; and
a light-emitting element electrically connected to the second terminal,
wherein a region of the first terminal overlapping with the gate electrode is smaller than a region of the second terminal overlapping with the gate electrode.

2. The display device according to claim 1,
wherein the oxide semiconductor film has a first side and a second side opposing each other, and
wherein a portion of the first side overlapping with the first terminal is shorter than a portion of the second side overlapping with the second terminal.

3. The display device according to claim 1,
wherein the second terminal has an open shape, and
wherein the first terminal is arranged so as to intersect an opening of the open shape.

4. The display device according to claim 1,
wherein the first transistor is configured so that current flows from the first terminal to the second terminal.

5. The display device according to claim 1,
wherein the gate electrode is shared by the first transistor and the capacitor.

6. The display device according to claim 1,
wherein the first electrode overlaps with the oxide semiconductor film.

7. The display device according to claim 1, wherein the at least one of the plurality of pixels further comprises a second transistor including:
a gate electrode;
a semiconductor film;
the insulating film sandwiched between the gate electrode and the semiconductor film; and
a first terminal and a second terminal electrically connected to the semiconductor film, and
the second terminal of the second transistor is electrically connected to the gate electrode of the first transistor.

8. The display device according to claim 7,
wherein the semiconductor film includes silicon.

9. The display device according to claim 7,
wherein the semiconductor film includes an oxide semiconductor.

10. The display device according to claim 9,
wherein the semiconductor film has a first side and a second side opposing each other, and
wherein, in the second transistor, a portion of the first side of the second transistor overlapping with the first terminal of the second transistor is longer than a portion of the second side of the second transistor overlapping with the second terminal of the second transistor.

11. The display device according to claim 9,
wherein, in the second transistor, the first terminal of the second transistor has an open shape, and the second terminal of the second transistor is arranged so as to intersect an opening of the open shape of the second transistor.

12. The display device according to claim 7,
wherein, in the second transistor, a region of the first terminal of the second transistor overlapping with the gate electrode of the second transistor is larger than a region of the second terminal of the second transistor overlapping with the gate electrode of the second transistor.

13. The display device according to claim 1,
wherein the at least one of the pixels further comprises a second transistor including:
- a second gate electrode existing in the same layer as the gate electrode;
- a second gate insulating film arranged under the second gate electrode; and
- a semiconductor film arranged under the second gate insulating film.

14. The display device according to claim 13,
wherein at least one of the pixels further comprises a capacitor including:
- the gate electrode;
- the second gate insulating film; and
- an electrode existing in the same layer as the semiconductor film.

15. The display device according to claim 14,
wherein the semiconductor film and the electrode are each a polycrystalline semiconductor film.

* * * * *